US012591717B2

(12) United States Patent
    Boettner

(10) Patent No.: US 12,591,717 B2
(45) Date of Patent: Mar. 31, 2026

(54) FILLING A MESH HOLE

(71) Applicant: EXOCAD GMBH, Darmstadt (DE)

(72) Inventor: Stefan Boettner, Darmstadt (DE)

(73) Assignee: EXOCAD GMBH, Darmstadt (DE)

( * ) Notice: Subject to any disclaimer, the term of this patent is extended or adjusted under 35 U.S.C. 154(b) by 1092 days.

(21) Appl. No.: 17/342,205

(22) Filed: Jun. 8, 2021

(65) Prior Publication Data

US 2022/0391548 A1    Dec. 8, 2022

(51) Int. Cl.
G06F 30/10 (2020.01)
G06T 7/00 (2017.01)

(52) U.S. Cl.
CPC ............ G06F 30/10 (2020.01); G06T 7/0012 (2013.01); *G06T 2200/04* (2013.01); *G06T 2207/30036* (2013.01)

(58) Field of Classification Search
CPC ... G06F 30/10; G06T 7/0012; G06T 2200/04; G06T 2207/30036; G06T 17/20
See application file for complete search history.

(56) References Cited

U.S. PATENT DOCUMENTS

2013/0297059 A1* 11/2013 Grifith .................. B29C 64/386
                                                         700/98
2022/0237803 A1* 7/2022 Pekelny .................. G06T 15/20

OTHER PUBLICATIONS

Feng, Chao, et al. "A fast hole-filling method for triangular mesh in additive repair." Applied Sciences 10.3 (2020): 969. (Year: 2020).*
Zhao et al. ("A robust hole-filling algorithm for triangular mesh." The Visual Computer 23 (2007): 987-997.) (Year: 2007).*
Botsch, Mario, et al. "Geometric modeling based on triangle meshes." ACM SIGGRAPH 2006 Courses. 2006. 1-es. (Year: 2006).*
Zhao, Wei., "A robust hole-filling algorithm for triangular mesh." The Visual Computer 23 (2007): 987-997.
Hu, Ping, et al. "Filling Holes in Triangular Meshes in Engineering." J. Softw. 7.1 (2012): 141-148.
Brunton, Alan, et al. "Filling holes in triangular meshes by curve unfolding." 2009 IEEE International Conference on Shape Modeling and Applications. IEEE, 2009.

* cited by examiner

*Primary Examiner* — Renee D Chavez
*Assistant Examiner* — Pursottam Giri
(74) *Attorney, Agent, or Firm* — PERRY + CURRIER INC.

(57) ABSTRACT

The invention relates to a method for filling a mesh hole in a mesh of a 3D digital model. A boundary of the mesh hole is provided by a first closed boundary curve comprising boundary edges connecting boundary vertices of a first plurality of boundary vertices. The method comprises selecting a maximized triple of boundary vertices comprising a first, a second and a third boundary vertex. The selected maximized triple is maximized by selecting a boundary vertex of the first plurality of boundary vertices as the third boundary vertex of the selected maximized triple. The selected maximized triple satisfies a first criterion. The first and the second vertex of the selected maximized triple are connected using a connecting curve from the first to the second boundary vertex.

18 Claims, 11 Drawing Sheets

100

100

102

100

100

100

103    102

100

103   102

100

103    102

10

COMPUTER SYSTEM SERVER    28

12

16

PROCESSING UNIT 18
22

24

DISPLAY

I/O INTERFACE(S)

14

EXTERNAL DEVICE(S)

MEMORY

30

RAM

CACHE

32

STORAGE SYSTEM 40
42

20

NETWORK ADAPTER

FILLING A MESH HOLE

The invention relates to the field of computer added design. More particularly, the invention relates to a method for filling a mesh hole in a mesh of a 3D digital model. The invention furthermore relates to a computer program as well as to a computer system for filling a mesh hole in a mesh of a 3D digital model.

Computer-aided design (CAD) is wildly used for generating, modifying, analyzing, and/or optimizing 3D digital models of 3D objects to be produced. The geometrical form of those 3D digital models, i.e., the surfaces of those 3D objects as defined by the respective 3D digital models, may be described using mesh structures. However, such mesh structure may not always be perfect, but may rather comprise defects, e.g., holes. Such mesh holes may arise for multiple reasons. However, for further usage of such incomplete meshes, it may be required to close these holes. In general, a mesh of a 3D digital model surrounding a mesh hole may not be planar. Therefore, filling such mesh holes may constitute a non-trivial task.

Most approaches to fill such a mesh hole in a 3D digital model, like the one described in "Filling holes in triangular meshes by curve unfolding" by Alan Brunton et al. in "2009 IEEE International Conference on Shape Modeling and Applications, SMI 2009", pages 66 to 72, try to turn the 3D problem into a 2D problem. However, such an approach may lead to insufficient results, e.g., in case of complex boundaries of the mesh hole. Other approaches, like the advancing front approach presented in "A Robust Hole-Filling Algorithm for Triangular Mesh" by Wei Zhao et al. in "The Visual Computer", volume 23, 2007, pages 22 to 32, may produce suboptimal geometries and require postprocessing steps. These postprocessing steps are usually based on the Laplace or Poisson equations. Since a surface interpolated using the Laplace equation has mean curvature zero, a mesh hole filled with such a surface tends to be not very natural, if the natural surface actually has a mean curvature different from zero. For the Poisson equation on the other side, finding an appropriate right-hand side of the equation may not be trivial. Moreover, it may be difficult to ensure that the advancing front approach will terminate, in particular for mesh holes with complex or degenerated boundaries.

It is an objective of the present invention to provide for a method, a computer program product as well as a computer system for filling a mesh hole in a mesh of a 3D digital model.

In one aspect, the invention relates to a method for filling a mesh hole in a mesh of a 3D digital model. The mesh comprises by a plurality of vertices. The mesh further defines a plurality of edges. A boundary of the mesh hole is provided by a first closed boundary curve comprising boundary edges connecting boundary vertices of a first plurality of boundary vertices. The first plurality of boundary vertices comprises a first number of boundary vertices. The first number of boundary vertices is four or more.

The method comprises selecting a maximized triple of boundary vertices comprising a first, a second and a third boundary vertex of the first plurality of boundary vertices without a single edge connecting the first and second vertex. The selected maximized triple is maximized by selecting a boundary vertex of the first plurality of boundary vertices as the third boundary vertex of the selected maximized triple such that a maximized angle between a first vector from the third boundary vertex to the first boundary vertex and a second vector from the third boundary vertex to the second boundary vertex is maximized compared to selecting any other boundary vertex of the first plurality of boundary vertices as the third boundary vertex. The selected maximized triple satisfies a first criterion. The first criterion requires the maximized angle to be smaller than or equal to 90°. The first and the second vertex of the selected maximized triple of boundary vertices are connected using a connecting curve from the first to the second boundary vertex.

The method of filling a mesh hole described herein may have the beneficial effect of providing high quality results using a simple approach without requiring any additional complex data structures. For example, natural results may be produced with no additional posterior refinements being necessary.

The proposed method uses a divide-and-conquer-approach, in which the boundary curve of the mesh hole to be filled may be split at a suitable location. Each boundary curve resulting from the splitting is smaller than the boundary curve provided before the splitting. The filling may continue recursively on the smaller boundary curves resulting from the splitting. Unlike other approaches, e.g., the advancing front approach, which at a given step may even increase the size of a boundary curve of a mesh hole, examples described herein may terminate after a finite number of steps.

The proposed method allows for a splitting of a boundary curve even across wide gaps, i.e., connecting boundary vertices by a connecting curve which may be separated by an arbitrary distance. Thus, mesh holes of arbitrary size may be filled.

Such mesh holes to be closed may arise for multiple reasons. For example, a mesh hole may arise due to missing data. The mesh may be provided using scan data acquired by using a scanner, e.g., an optical scanner, for scanning a 3D object. In case a view of the scanner is obstructed, scan data for certain parts of the 3D object may be missing, resulting in a mesh hole of a mesh reconstructed using the scan data provided. Furthermore, it may be necessary to remove undesired portions of a mesh resulting in mesh holes. Such a removal may be executed automatically, semiautomatically, or manually. Removing portions of a mesh may for example be necessary in order to remove one or more scanning artifacts comprised by the respective portion. Furthermore, a portion of a mesh may be removed in order to remove a part or an element of the 3D object represented by the mesh of the 3D digital model.

In the course of searching for a suitable split location, the maximized triplet satisfying the first criterion may be selected. For example, it may be searched for a best split location. A suitable split location may be defined by the first vertex $v_i$ and the second vertex $v_j$ of the selected maximized triple of boundary vertices. The closed boundary curve is split at $v_i$ and $v_j$ by inserting the connecting curve between $v_i$ and $v_j$, yielding two new boundary curves on which the method may proceed recursively. The connecting curve may be chosen such that it is tangential to the existing surface at its end points.

The mesh may comprise a plurality of vertices. A vertex defines a position in 3D space. In addition, a vertex may be assigned with additional information, like a normal vector. A normal vector may, e.g., be defined implicitly, e.g., as a weighted average of normals of adjacent triangles. A vertex w is said to be adjacent to another vertex v, if the mesh contains an edge (v, w). An edge is a connection between two vertices. A mesh may be represented in different ways, using different methods to store data defining elements of the mesh, like the vertex, edge and/or face data. A face is a closed set of edges. A triangle face for example is a closed set comprising three edges. Exemplary representations of meshes, e.g., comprise face-vertex meshes, winged-edge meshes, half-edge meshes, quad-edge meshes, corner-table meshes, vertex-vertex meshes, render dynamic meshes etc.

The method may be applied to a sequence of boundary vertices $v_1, \ldots, v_m \in \mathbb{R}^3$ comprised by a boundary curve of a mesh hole. In addition, normal vectors $n_1, \ldots, n_m \in \mathbb{R}^3$ may be provided as input. Let $\theta_i$ denote the angle at $v_i$, i.e., between the vectors $(v_{i+1}-v_i)$ and $(v_{i-1}-v_i)$ with the convention that $v_0=v_m$ and $v_1=v_{m+1}$.

A suitable splitting pair $(i, j)$ may, e.g., be a split for which a connecting edge $(v_i, v_j)$ satisfies the Delaunay criterion for edges, i.e., where a ball with diameter $(v_i, v_j)$ does not contain any other boundary vertices. The boundary vertices $v_i$ and $v_j$, are comprised by the surface of the respective ball.

Here, (i, j, k) refers to a set of three indices into the list of boundary vertices. For each triple of boundary vertices, e.g., indicated by (i, j, k), $\phi_{i,j,k}$ denotes the angle of the triangle $(v_i, v_j, v_k)$ at $v_k$, i.e., between the vectors $(v_i-v_k)$ and $(v_j-v_k)$. For each pair of boundary vertices, indicated by (i, j), a third boundary vertex, indicated by the index k, may be determined for which the angle $\phi_{i,j,k}$ is maximized. The maximized angle is denoted by $\phi_{i,j}$, i.e., $$\phi_{i,j} = \max_{k \neq i,j} \phi_{i,j,k}.$$

Thus, for each pair of boundary vertices, indicated by (i, j), a maximized triple of boundary vertices, indicated by (i, j, k), may be identified with a maximized angle $$\max_{k \neq i,j} \phi_{i,j,k}$$

of the triangle $(v_i, v_j, v_k)$ at $v_k$, i.e., between the vectors $(v_i-v_k)$ and $(v_j-v_k)$. From the resulting plurality of maximized triples, i.e., for all pairs of boundary vertices, a maximized triple may be selected with the maximized angle $$\max_{k \neq i,j} \phi_{i,j,k} \leq 90°.$$

For example, as an additional criterion it may be explicitly checked that the split is actually in front of the boundary, i.e., that the connecting curve is added within the closed boundary curve, and not behind the boundary curve, i.e., excluding any connecting curve extending outside the boundary curve. Any split candidates not satisfying this additional criterion may be discarded. Thus, overlapping and/or self-intersecting mesh geometries may be effectively prevented.

Once a splitting pair of vertices, indicated by (i, j), is selected, the boundary curve may be split into two boundary curves $v_1, \ldots, v_i, w_1, \ldots, w_r, v_j, \ldots, v_m$ and $v_i, \ldots, v_j, w_r, \ldots, w_1$ where $w_1, \ldots, w_r$ are newly inserted vertices. The method may then proceed recursively on each of these new boundary curve.

Once a suitable splitting pair, indicated by (i, j), has been found, a connecting curve c: $[0,1] \rightarrow \mathbb{R}^3$ such that it connects $v_i$ to $v_j$, i.e., $c(0)=v_i$ and $c(1)=v_j$, may be added. The connecting curve may be tangential to the existing mesh surface at its endpoints. This may be achieved by making it orthogonal to the surface normal vectors $n_i$ at $v_i$ and $n_j$ at $v_j$, i.e., $c'(0) \cdot n_i=0$ and $c'(1) \cdot n_j=0$.

For example, the connecting comprises adding one or more additional boundary vertices along the connecting curve. These additional boundary vertices define additional boundary edges along the connecting curve. Furthermore, the additional boundary edges may be added along the connecting curve. The additional boundary edges may connect the first and the second vertex via the additional boundary vertices.

With adding the additional boundary vertices, the mesh hole may be split in two. Repeating this procedure of identifying suitable split locations at the boundary curve of the mesh hole and splitting the mesh hole by adding additional boundary vertices along a connecting curve at the identified split location, the mesh hole may successively be filled.

The additional vertices added along the connecting curve may be Steiner vertices. Here, a Steiner vertex refers to a vertex, which is not part of the input, but is added during the filling of the mesh hole as an additional vertex. Thus, a number of Steiner vertices may be added along the curve between $v_i$ and $v_j$. The number of Steiner vertices may be limited such that at most as many Steiner vertices are added such that both new boundary curves will be strictly smaller in size than the split boundary curve by the connecting curve.

For example, the only means by which Steiner vertices may be added to the triangulation of the mesh hole may be by adding additional boundary vertices along connecting curves inserted in order to split a boundary curve.

There may be given $O(n^2)$ many vertex pairs of boundary vertices and evaluation of a vertex pair may need to consider all other boundary vertices, but finding a suitable pair, in particular a best pair, may still be done in $O(n^2)$ time in practice. Assuming that the boundary splits are reasonably balanced, this means the method may run in about $O(n^2)$ average time. A uniform triangulation will require $O(n^2)$ Steiner points anyway, though a non-uniform triangulation with longer edges further away from the original boundary could be done faster and with fewer Steiner points.

For example, the additional boundary edges connecting the first and the second vertex of the selected maximized triple via the additional boundary vertices split the first closed boundary curve into a new second and a new third closed boundary curve. The new second closed boundary curve comprises boundary edges connecting boundary vertices of a second plurality of boundary vertices including the additional boundary vertices. The second plurality of boundary vertices comprises a second number of boundary vertices. The new third closed boundary curve comprises boundary edges connecting boundary vertices of a third plurality of boundary vertices including the additional boundary vertices. The third plurality of boundary vertices comprises a third number of boundary vertices. The second and the third number of boundary vertices each are smaller than the first number of boundary vertices.

Since the second and the third number of boundary vertices are each smaller than the first number of boundary vertices, the new boundary curves resulting from the splitting, i.e., the second and third closed boundary curves, are each smaller in size than the first closed boundary curve being split. In this context, size of a boundary curve is defined in terms of the number of boundary vertices the respective boundary curve comprises. The more boundary vertices the boundary curve comprises, the larger it is. The less boundary vertices the boundary curve comprises, the smaller it is.

By ensuring that the new boundary curves resulting from a splitting of a boundary curve to be split are each smaller than the boundary curve to be split, it may be effectively ensured that the filling of the mesh hole will terminate after a finite number of steps.

For example, the first and the second boundary vertex of the selected maximized triple further satisfy a second criterion. The second criterion requires the distance between the first and the second boundary vertex of the selected maximized triple to be a minimum distance compared to the distance of any other first and second boundary vertex of any other maximized triple of boundary vertices. The other maximized triples are each maximized by selecting a boundary vertex of the first plurality of boundary vertices as another third boundary vertex of the respective other maximized triple such that a maximized angle between another first vector from the other third boundary vertex of the respective other maximized triple to the other first boundary vertex of the respective other maximized triple and another second vector from the other third boundary vertex of the respective other maximized triple to the other second boundary vertex of the respective other maximized triple is maximized compared to selecting any other boundary vertex of the first plurality of boundary vertices as the other third boundary vertex of the respective other maximized triple.

With the distance between the first and the second boundary vertex of the selected maximized triple being minimum distance compared to the distance of any other first and second boundary vertex of any other maximized triple of boundary vertices, the distance to be spanned by the connecting curve may be minimized. This may facilitate the construction of the connecting curve and may limit the number of additional boundary vertices to be added along the connecting curve. Restricting the number of additional boundary vertices being added may facilitate ensuring that the new boundary curves resulting from the splitting of the boundary curve being split are each smaller than the boundary curve being split.

For example, the selected maximized triple further satisfies a third criterion. The third criterion requires the maximized angle between the first and the second vector of the selected maximized triple to be a minimum maximized angle compared to any other maximized angle between any other first and second vector of any other maximized triple.

A graph obtained by connecting all boundary vertices with all edges that satisfy the Delaunay criterion for edges is a Gabriel graph. A generalization of this is the $\beta$-skeleton, which may, e.g., be defined using a circle-based or a lune-based criterion. In the following, the circle-based definition may be considered, but using the lune-based definition may be possible as well. For example, any edges between adjacent boundary vertices may be disregarded, since these will not result in a non-trivial split.

A $\beta$-skeleton is an undirected graph defined from a set of points in the Euclidean plane. Two points p and q are connected by an edge whenever all the angles prq are sharper than a threshold determined from the numerical parameter $\beta$.

In case of the circle-based criterion, with $\beta$ being a positive real number an angle $\vartheta$ may be defined as $$\vartheta = \sin^{-1}\frac{1}{\beta}$$

for $\beta \geq 1$ and $\vartheta = \pi - \sin^{-1}\beta$ for $\beta \leq 1$. For any two points p and q in the plane, let $R_{pq}$ be the set of points for which the angle prq is greater than $\vartheta$. For $\beta \geq 1$ and $\vartheta \leq \pi/2$, the region $R_{pq}$ may take the form of a union of two open disks with diameter $\beta d(p,q)$. For $\beta \leq 1$ and $\vartheta \geq \pi/2$ the region $R_{pq}$ may take the form of an intersection of two open disks with diameter $d(p,q)/\beta$. For $\beta = 1$, resulting in $\vartheta = \pi/2$, the region $R_{pq}$ takes the form of a single open disk with diameter with diameter pq. The $\beta$-skeleton of a discrete set S of points in the plane is the undirected graph that connects two points p and q with an edge pq, whenever $R_{pq}$ contains no points of S. Thus, the $\beta$-skeleton is the empty region graph defined by the regions $R_{pq}$. When S contains a point r for which angle prq is greater than $\vartheta$, then pq is not an edge of the $\beta$-skeleton, i.e., the $\beta$-skeleton consists of those pairs pq for which no such point r with angle prq is greater than $\vartheta$ exists.

In case of a lune-based criterion, the empty regions $R_{pq}$ for $\beta > 1$ are rather lenses ("lunes") than unions of two disks. These lenses are intersections of two congruent disks with diameter $\beta d(pq)$, such that the line segment pq lies on a radius of both disks and such that the points p and q both lie on the boundary of the intersection. As with the circle-based $\beta$-skeleton, the lune-based $\beta$-skeleton has an edge pq, whenever region $R_{pq}$ is empty of other input points.

As $\beta$ varies from 0 to $\infty$ the $\beta$-skeleton changes from an empty graph to a complete graph. Hence there must be a minimum $\beta$ for which the $\beta$-skeleton is non-empty. For example, the edge $(v_i, v_j)$ may be picked from this skeleton, which in most cases may be unique unless more than one edge is provided for this value of $\beta$. In case more than one edge is provided for this value of $\beta$, e.g., an arbitrary one of the edges provided may be chosen.

For the aforementioned circle-based definition of the $\beta$-skeleton, finding a minimum $\beta$ for which the $\beta$-skeleton is non-empty corresponds to finding a minimum $\phi_{i,j}$ with $\phi_{i,j}$ being defined as follows: For each triple of boundary vertices, e.g. indicated by (i, j, k), let $\phi_{i,j,k}$ be the angle of the triangle $(v_i, v_j, v_k)$ at $v_k$, i.e., between the vectors $(v_i - v_k)$ and $(v_j - v_k)$, and for each pair of boundary vertices, indicated by (i, j), define $$\phi_{i,j} = \max_{k \neq i,j}\phi_{i,j,k}.$$

In other words, it is searched for a pair (i, j), for which $\phi_{i,j}$ has the smallest value, i.e., which is a minimum $\phi_{i,j}$. A minimum $\phi_{i,j}$ is a minimum maximized angle with $$\max_{k \neq i,j}\phi_{i,j,k}$$

being the maximized angle of the maximized triple of boundary vertices, indicated by (i, j, k). For most pairs (i, j), the maximum $\phi_{i,j,k}$ may, e.g., be attained for a neighbor of $v_i$ or $v_j$, i.e., $k = i \pm 1$ or $k = j \pm 1$. This may allow for finding the optimal pair (i, j) in time $O(m^2)$.

For example, the third criterion is further used as fallback criterion for selecting a maximized triple, in case no maximized triple satisfying the first criterion. Thus, in case no maximized triple has a maximized angle smaller than or equal to 90°, a maximized triple with a minimum maximized angle may be selected, even if the minimum maximized angle is larger than 90°.

A suitable splitting pair of boundary vertices, indicated by (i, j), may, e.g., be a split for which a connecting edge $(v_i,$ $v_j$) satisfies the Delaunay criterion for edges, i.e., where a ball with diameter ($v_i$, $v_j$) does not contain any other boundary vertices. However, there may be no splitting pairs satisfying the Delaunay criterion. In that case, the first and second vertex $v_i$, $v_j$ of a maximized triple with a minimum maximized angle may be used as the splitting pair (i, j).

For example, the method further comprises repeating the selecting of a maximized triple of boundary vertices and the connecting of a first and a second boundary vertex of the selected maximized triple for any new closed boundary curve until the number of remaining boundary vertices is smaller than four, e.g., three. Thus, the boundary curves and as a consequence the remaining mesh holes are successively shrinking until the original mesh hole is filled completely. By connecting selected boundary vertices, new edges are added. Thus, the mesh hole is successively filled. When the number of remaining boundary vertices is three, i.e., smaller than four, the remaining boundary curve defines a triangle. When all the remaining boundaries only define triangles, a triangle mesh structure is provided in form of the added edges and vertices, which is assigned to the mesh. The added edges and vertices may define triangles of the respective triangle mesh structure. Thus, the triangle mesh structure becomes a part of the mesh closing the mesh hole.

By using the divide-and-conquer-approach described herein, the boundary curve of the mesh hole to be filled may recursively be split at suitable locations, resulting in smaller and smaller boundary curves until all the remaining boundary curves, e.g., only comprise three vertices each. Thus, each of these remaining boundaries may define a triangle. These triangles constructed within the mesh hole using the aforementioned approach may be added to the mesh, i.e., assigned as a part to the mathematical structure of, e.g., vertices, edges and triangles, defining the respective mesh.

For example, the connecting curve is tangential to a mesh surface at the first and the second vertex of the selected maximized triple. With the connecting curve being tangential to a mesh surface, a smooth transition from the original mesh to the section of the mesh added in order to fill the mesh hole may be implemented. With the connecting curve being tangential to a mesh surface at the first and the second vertex of the selected maximized triple, a derivative of the connecting curve is orthogonal to a mesh surface normal at the first and the second vertex of the selected maximized triple.

For example, a curvature of the connecting curve at the first and the second vertex of the selected maximized triple matches with a curvature of the mesh surface at the first and the second vertex of the selected maximized triple.

Constructing connecting curve which is tangential to the existing mesh surface at its endpoints may, e.g., be done using a Bezier curve. For example, a Bezier curve of degree two or higher, in particular of degree three or higher is used as a connecting curve.

A Bezier curve of degree three, i.e., a cubic Bezier curve, may, e.g., be formed as follows: Let $\vec{d}_{i,j} = v_j - v_i$ be the vector from $v_i$ to $v_j$. Let $\vec{d}_i$ and $\vec{d}_j$ be the projection of $\vec{d}_{i,j}$ into the tangential planes at $v_i$ and $v_j$ respectively, i.e., $$\vec{d}_i = \vec{d}_{i,j} - (\vec{d}_{i,j} \cdot n_i) n_i,$$

$$\vec{d}_j = \vec{d}_{i,j} - (\vec{d}_{i,j} \cdot n_j) n_j.$$

The projected vectors $\vec{d}_i$ and $\vec{d}_j$ may, e.g., be scaled to have the same length as $\vec{d}_{i,j}$. Then control points $p_0, \ldots, p_3$ may be defined as $$p_0 = v_i,$$

$$p_1 = v_i + \frac{1}{3}\vec{d}_i,$$

$$p_2 = v_j - \frac{1}{3}\vec{d}_j,$$

$$p_3 = v_j.$$

For example, positions of the additional boundary vertices along the connecting curve are chosen such that the lengths of the additional boundary edges increase with increasing distance from the first closed boundary curve. For example, the lengths may increase according to a geometrical progression. For example, the lengths may increase exponentially. With the lengths of the additional boundary edges increasing, the number of the additional boundary vertices may efficiently be restricted, ensuring a termination of the filling method. Furthermore, by adding fewer additional boundary edges further away from the boundary curve may reduce imprecisions introduced by interpolation, when constructing the connecting curve.

For example, a first length of a first additional edge connecting the first vertex of the selected maximized triple with a first additional boundary vertex of the additional boundary vertices matches, i.e., is identical, to a length of another boundary edge connecting the first vertex of the selected maximized triple with another boundary vertex of the first closed boundary curve or matches to a first mean length calculated using edges connecting the first vertex of the selected maximized triple with other vertices. For example, the first mean length may be calculated using the boundary edges connecting the first vertex of the selected maximized triple with other boundary vertices of the first closed boundary curve. For example, the first mean length may be calculated using the edge connecting the first vertex of the selected maximized triple with an adjacent vertex which is no boundary vertex. Thus, e.g., any vertex adjacent the first vertex of the selected maximized triple may be used for calculating the first mean length, regardless of whether the respective adjacent vertex is a boundary vertex or not. An adjacent vertex of the first vertex of the selected maximized triple is a vertex, which is connected with the first vertex of the selected maximized triple by a single edge.

For example, a second length of a second additional edge connecting the second vertex of the selected maximized triple with a second additional boundary vertex of the additional boundary vertices matches, i.e., is identical, to a length of another boundary edge connecting the second vertex of the selected maximized triple with another boundary vertex of the first closed boundary curve or matches to a second mean length calculated using edges connecting the second vertex of the selected maximized triple with other vertices. For example, the second mean length may be calculated using the boundary edges connecting the second vertex of the selected maximized triple with other boundary vertices of the first closed boundary curve. For example, the second mean length may be calculated using the edge connecting the second vertex of the selected maximized triple with an adjacent vertex which is no boundary vertex. Thus, e.g., any vertex adjacent the second vertex of the selected maximized triple may be used for calculating the second mean length, regardless of whether the respective adjacent vertex is a boundary vertex or not. An adjacent vertex of the second vertex of the selected maximized triple is a vertex, which is connected with the second vertex of the selected maximized triple by a single edge.

Thus, a uniform transition in terms of edge length from the original mesh to the section of the mesh added in order to fill the mesh hole may be implemented.

The connecting curve added may be subdivided. Subdividing the connecting curve may comprise inserting r new vertices $w_1, \ldots, w_r$. The parameter r may be chosen such that edge lengths at the beginning and end of the connecting curve approximately match those edge lengths at the boundary, i.e., the boundary edges. At the same time, the parameter r may be limited such that the sizes of the resulting new boundary curves in terms of a number of vertices are strictly smaller than the size of the boundary curve being split by the connecting curve. Thus, it may be effectively ensured that the method will terminate. Typically, the connecting curve may be much shorter than the length of the parts of the boundary curve on either side, facilitating the respective limiting of the parameter r. Furthermore, it may be desirable to have a coarser triangulation away from the boundary curve, corresponding to a larger separation of the Steiner vertices, i.e., vertices $w_1, \ldots, w_r$, in the middle of the connecting curve compared to near the beginning c(0) and end c(1) of the connecting curve.

Desired edge lengths a>0 and b>0 near the beginning and end of the connecting curve, respectively, may be defined. An incomplete curve parameter integral may be defined as $$I(x, y) := \int_0^x e^{\frac{\lambda(y-t)}{v} + \frac{\mu t}{v} + vt(v-t)} dt,$$

with $$\lambda := \log a,$$

$$\mu := \log b.$$

An edge growth constant v≥0 may determine by how much edge lengths should increase away from the boundary. Thus, it may hold that $$\left. \frac{\partial I}{\partial x}(x, y) \right|_{x=0} = a,$$

$$\left. \frac{\partial I}{\partial x}(x, y) \right|_{x=y} = b.$$

I(x, y) has a closed form representation involving the error function.

Next, a complete curve parameter integral may be defined as I(y):=I(y, y). Since I(y)=0 and I'(y)>0, I(y) is increasing. In fact, if y>0, I(y) may be increasing fast. Hence for a given connecting curve length $\ell$ >0, a $\bar{y}$>0 may be found such that I($\bar{y}$)= $\ell$ . The $\bar{y}$ may be expected to be small. Now, r may be chosen such that r≈$\bar{y}$−1 by rounding and bounding such that the resulting curves will be smaller than the original curve. Then, split vertex $w_k$ may be added at $$w_k = c\left( \frac{I(k, r+1)}{I(r+1)} \right)$$

along the connecting curve. For the newly added vertices $w_1, \ldots, w_r$, new normal vectors may be computed by interpolating normal vectors $n_i$ and $n_j$, and making them orthogonal to the connecting curve.

At this point of the method, e.g., no new triangles may be added. New triangles may, e.g., eventually be added by "ear cutting" as the method recurses into the new boundary curves.

For example, the method comprises preparing the mesh hole and the first closed boundary curve for selecting the maximized triple. The preparing comprises determining along the first closed boundary curve three consecutive boundary vertices comprising an angle between a first and a second boundary edge connecting the determined three consecutive boundary vertices. The angle is equal to or smaller than a predefined threshold. The first closed boundary curve is altered by inserting an additional boundary edge between the two outer boundary vertices of the determined three consecutive boundary vertices such that a middle boundary vertex of the determined three consecutive boundary vertices is excluded from the first plurality of boundary vertices. By inserting such an additional boundary edge, an additional triangle is defined, i.e., a single additional triangle may be inserted.

Before splitting, the closed boundary curve may be altered in order to "cut ears", where the angle is sufficiently small. By doing so, the size of the closed boundary curve may, e.g., strictly be reduced.

As explained above, the method may be applied to a sequence of boundary vertices $v_1, \ldots, v_m \in \mathbb{R}^3$ comprised by a boundary curve of a mesh hole. Let $\theta_i$ denote the angle at $v_i$, i.e., between the vectors $(v_{i+1}-v_i)$ and $(v_{i-1}-v_i)$ with the convention that $v_0=v_m$ and $v_1=v_{m+1}$. Thus, all the angles θ along the closed boundary curve may be considered with each of the angles θ being defined by three consecutive boundary vertices. Each of these angles θ is spanned between a first and a second boundary edge connecting the respective three consecutive boundary vertices. Let i be such that $\theta_i \leq \theta_j$ for all 1≤j≤m with i≠j. Thus, an angle $\theta_i$ at $v_i$, i.e., between the vectors $(v_{i+1}-v_i)$ and $(v_{i-1}-v_i)$, is selected, which is the smallest one of all the angles θ along the boundary curve. An additional boundary edge is inserted to insert an additional triangle, if the selected smallest angle $\theta_i$ at $v_i$ is smaller than or equal to predefined threshold $\theta_{thresh}$. If $\theta_i \leq \theta_{thresh}$, the "ear" at $v_i$ may be cut by inserting the triangle $(v_{i-1}, v_i, v_{i+1})$ and then remove $v_i$ from the sequence of boundary vertices. Thus, the number of boundary vertices comprised by the closed boundary curve and thus the size of the boundary curve may be reduced. The method may proceed with "cutting ears" recursively.

The "ear cutting" may further be performed for each new boundary curve resulting from a splitting of a boundary curve.

For example, the predefined threshold may for example be one of the following: 60°, 65°, 70°, 75° or 80°. An angle of 60° may correspond to an equilateral triangle. Using a threshold near 60° may result in introducing triangles which approximate equilateral triangles.

For example, the determining of three consecutive boundary vertices comprising an angle being equal to or smaller than the predefined threshold and the altering of the first closed boundary curve is repeated until all remaining angles of three consecutive boundary vertices exceed the predefined threshold. Then, the method may, e.g., be continued with the search for a splitting location and the splitting.

If no sufficiently small minimum angles remain anymore or if from the beginning no sufficiently small minimum angles exist, the method may continue with searching for a suitable split location, i.e., selecting a maximized triplet satisfying the first criterion. For example, a best split location may be searched for.

In other words, if all $\theta_i > \theta_{thresh}$, then the method may look for an optimal splitting pair (i, j) of boundary vertices $v_i$ and $v_j$. In case, such a splitting pair (i, j) is found, the closed boundary curve may be split into two smaller closed boundary curves on which the method proceeds recursively. The two smaller closed boundary curves may be generated by adding a connecting curve connecting the splitting pair (i, j) of boundary vertices $v_i$ and $v_j$.

The "ear cutting" may, e.g., be executed after each splitting of a boundary curve during the recursive execution of the filling method.

For example, the 3D digital model comprises a plurality of structural elements, wherein the mesh hole results from removing one or more of the structural elements from the 3D digital model. The original 3D digital model may be free of mesh holes. However, modifying the 3D digital model may introduce one or more mesh holes to be filled. For example, the 3D digital model may be a model of a dental structure from which a dental element, like a tooth or a part of a tooth, is to be removed, resulting in one or more mesh holes to be filled.

For example, the mesh of the 3D digital model results from a scan, e.g., an optical scan, of a 3D physical structure. The scan may, e.g., be a scan of a dental structure, like an intraoral scan of a patient's dentition, a scan of a dental impression or a scan of a dental model, like a plaster model. In case a view of the scanner is obstructed, scan data for certain parts of the 3D object may be missing, resulting in a mesh hole of a mesh reconstructed using the scan data provided. For example, drops of saliva may obstruct the view of an optical intraoral scanner, which may result in a mesh hole.

For example, the mesh hole results from incomplete scan data of the 3D physical structure or from removing one or more scan artifacts from the 3D digital model. The scan data may, e.g., comprise scan artifacts resulting in erroneous mesh sections, which may have to be removed. A removal of such erroneous mesh sections may result in mesh holes. The removal may be executed automatically, semiautomatically, or manually.

For example, the 3D digital model is a 3D digital model of a dental structure comprising one or more dental elements.

For example, the 3D digital model is used for generating a 3D digital template, wherein the 3D digital template is used for manufacturing a physical 3D copy of the 3D digital template. For example, the manufacturing requires and/or is improved by filling the mesh hole.

Generating the 3D digital template may comprise filling the mesh hole. Thus, the mesh hole may be filled and the 3D digital template with the filled mesh hole may be used for manufacturing a physical 3D copy of the 3D digital template. For manufacturing the physical 3D copy manufacturing devices, like machining or 3D printing devices, may be used. These manufacturing devices may be controlled by a computer system provided with the 3D digital model being used as a 3D digital template for manufacturing.

In another aspect, the invention relates to a computer program product comprising a non-volatile computer-readable storage medium having computer-readable program code embodied therewith for filling a mesh hole in a mesh of a 3D digital model. The mesh comprises by a plurality of vertices. The mesh further defines a plurality of edges. A boundary of the mesh hole being provided by a first closed boundary curve comprising boundary edges connecting boundary vertices of a first plurality of boundary vertices.

The first plurality of boundary vertices comprises a first number of boundary vertices. The first number of boundary vertices four or more.

The filling comprises selecting a maximized triple of boundary vertices comprising a first, a second and a third boundary vertex of the first plurality of boundary vertices without a single edge connecting the first and second vertex. The selected maximized triple is maximized by selecting a boundary vertex of the first plurality of boundary vertices as the third boundary vertex of the selected maximized triple such that a maximized angle between a first vector from the third boundary vertex to the first boundary vertex and a second vector from the third boundary vertex to the second boundary vertex is maximized compared to selecting any other boundary vertex of the first plurality of boundary vertices as the third boundary vertex. The selected maximized triple satisfies a first criterion. The first criterion requires the maximized angle to be smaller than or equal to 90°. The first and the second vertex of the selected maximized triple of boundary vertices are connected using a connecting curve from the first to the second boundary vertex.

The computer-readable program instructions of the computer program product may be configured for filling a mesh hole in a mesh of a 3D digital model according to any of the aforementioned examples.

In another aspect, the invention relates to a computer system for filling a mesh hole in a mesh of a 3D digital model. The computer system comprises a processor and a memory storing machine-executable program instructions. The mesh comprises by a plurality of vertices. The mesh further defines a plurality of edges. A boundary of the mesh hole is provided by a first closed boundary curve comprising boundary edges connecting boundary vertices of a first plurality of boundary vertices. The first plurality of boundary vertices comprises a first number of boundary vertices. The first number of boundary vertices is four or more.

Execution of the program instructions by the processor causes the processor to control the computer system to select a maximized triple of boundary vertices comprising a first, a second and a third boundary vertex of the first plurality of boundary vertices without a single edge connecting the first and second vertex. The selected maximized triple is maximized by selecting a boundary vertex of the first plurality of boundary vertices as the third boundary vertex of the selected maximized triple such that a maximized angle between a first vector from the third boundary vertex to the first boundary vertex and a second vector from the third boundary vertex to the second boundary vertex is maximized compared to selecting any other boundary vertex of the first plurality of boundary vertices as the third boundary vertex. The selected maximized triple satisfies a first criterion. The first criterion requires the maximized angle to be smaller than or equal to 90°. The first and the second vertex of the selected maximized triple of boundary vertices are connected using a connecting curve from the first to the second boundary vertex.

The computer system may be configured for filling a mesh hole in a mesh of a 3D digital model according to any of the aforementioned examples.

For example, the computer system is part of a system further comprising a manufacturing device configured for manufacturing a physical 3D copy a 3D digital template provided using the 3D digital model. For example, the 3D digital model is used for generating the 3D digital template. For example, the manufacturing requires and/or is improved by filling the mesh hole. Generating the 3D digital template may comprise filling the mesh hole. Thus, the mesh hole may be filled and the 3D digital template with the filled mesh hole may be used for manufacturing a physical 3D copy of the 3D digital template.

For example, the manufacturing device comprises a 3D printing device and/or a machining device.

For example, the system further comprises a scanning device, e.g., comprising an optical scanner, configured for scanning a 3D physical structure. For example, the mesh of the 3D digital model may result from a scan of a 3D physical structure. Scan data provided by the scanning device may be used to provide the 3D digital model. For example, the 3D digital model is a digital replica of the scanned 3D physical structure. The scan may, e.g., be a scan of a dental structure, like an intraoral scan of a patient's dentition, a scan of a dental impression or a scan of a dental model, like a plaster model. In case a view of the scanner is obstructed, scan data for certain parts of the 3D object may be missing, resulting in a mesh hole of a mesh reconstructed using the scan data provided. For example, drops of saliva may obstruct the view of an optical intraoral scanner, which may result in a mesh hole.

The above-described examples and embodiments may be combined freely as long as the combinations are not mutually exclusive.

In the following, embodiments of the invention are described in greater detail in which FIG. 1 shows a flowchart illustrating an exemplary method for filling a mesh hole;

In the following similar features are denoted by the same reference numerals.

Figure 1:
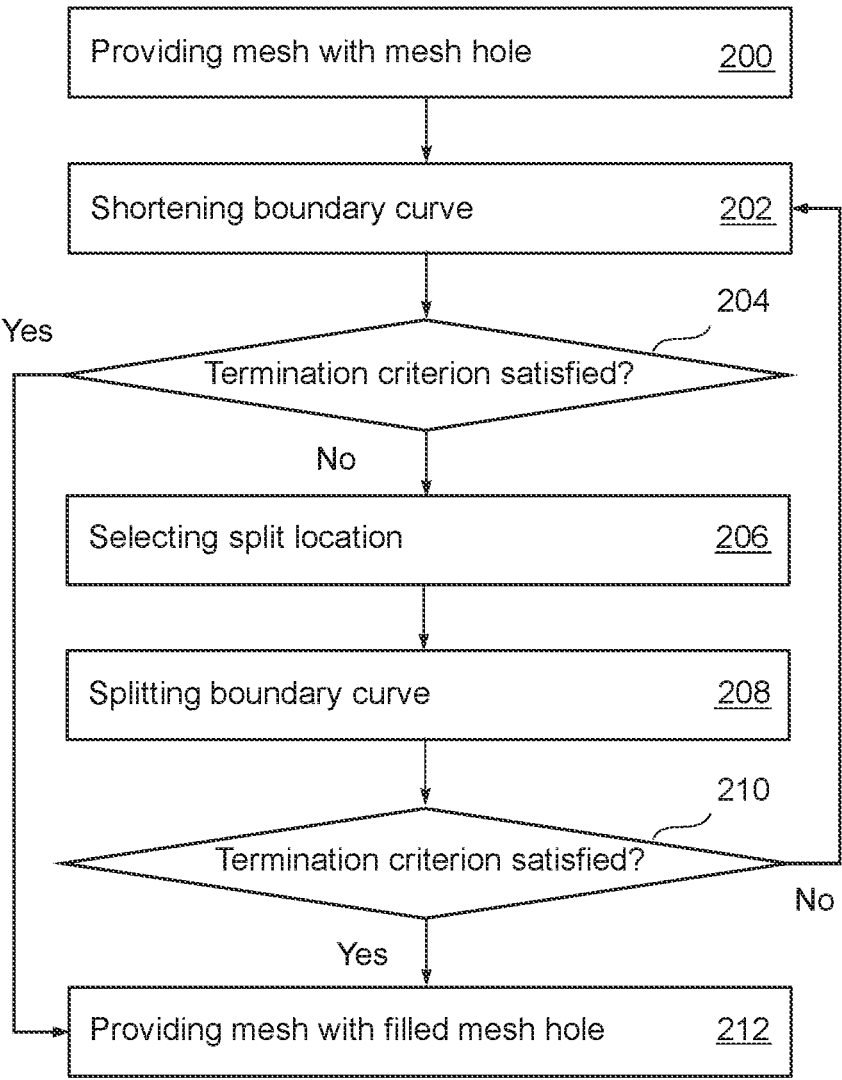

FIG. 1 shows an exemplary method for filling a mesh hole in a mesh of a 3D digital model. In block 200, the 3D digital model with the mesh comprising a mesh hole is provided. The 3D digital model may, e.g., be the result of a reconstructed using a set of scan data acquired using a scanner, e.g., an optical scanner. The 3D digital model may, e.g., be a digital copy of a physical template, i.e., a 3D physical object may be scanned and the scan data used to provide the 3D digital model resembling the 3D physical object. The 3D digital model may result from processing, e.g., modifying, a 3D digital model reconstructed using scan data. The 3D digital model may be generated from scratch or the 3D digital model may be generated using one or more templates, e.g., from a template library. These templates may be selected, combined and/or modified in order to generate the 3D digital model. The 3D digital model may as well result from a combination of a reconstruction using scan data and adding elements generated from scratch or using templates. In the field of dental technology, scan data may for example be used for providing a digital replica of an existing dental object, like a dental prothesis, a tooth, a part of a dentition, or a full dentition. This digital replica may be modified and/or additional objects may be added. For example, one or more teeth from a library may be added or a template for a dental prothesis may be added.

The mesh may define a surface of the 3D digital model. The mesh hole comprised by the mesh may result from missing scan data. Scan data used for providing the 3D digital model may be incomplete, e.g., due to a partial obstruction of a view of the scanner during data acquisition. In this case, the mesh may initially comprise the mesh hole. Alternatively, the mesh hole may result from a purposeful removal of a selected portion of the mesh. In this case, the mesh may initially be free of mesh holes and the mesh hole may be implemented as part of a processing of the 3D digital model. Such a removal may be executed automatically, semiautomatically, or manually. Removing a portion of a mesh may for example be necessary in order to remove one or more scanning artifacts comprised by the respective portion. Furthermore, a portion of the mesh may be removed in order to remove a part or an element of the 3D object represented by the mesh of the 3D digital model. For example, a tooth may be removed from a denture or a part of a tooth may be removed. The removal may result in a mesh hole. A boundary of the mesh hole may be defined by closed boundary curve.

In order to fill the mesh hole, a divide-and-conquer-approach is used. The mesh hole is split by adding a connection curve. Along the connection curve additional boundary vertices may be added. The mesh holes resulting from splitting the preceding mesh hole may each be smaller than the preceding mesh hole, i.e., the boundary curves of the resulting mesh holes may each be smaller than the boundary curve of the preceding mesh hole in view of the number of boundary vertices comprised. This procedure may be applied recursively until all mesh holes are filled, e.g., no mesh holes comprising more than three boundary vertices remain.

In block 202, an optional preparation may be executed. In order to prepare the mesh hole for the splitting, the boundary curve of the mesh hole may be shortened. Thereby, the size of the boundary curve in terms of the number of boundary vertices comprised by the boundary curve may be reduced by one with each shortening. This shortening of the boundary curve may also be referred to as "ear cutting". Along the closed boundary curve, it may be searched for any three consecutive boundary vertices $v_{i-1}$, $v_i$ and $v_{i+1}$ defining an angle $\theta_i$ equal to or smaller than a predefined threshold $\theta_{thresh}$. The predefined threshold $\theta_{thresh}$, may for example be 75°, i.e., $\theta_{thresh}=75°$. The three consecutive boundary vertices may define a first boundary edge between $v_{i-1}$ and $v_i$ as well as a second boundary edge $v_i$ and $v_{i+1}$. Between these two boundary edges the angle $\theta_i$ is spanned. In case three consecutive boundary vertices $v_{i-1}$, $v_i$ and $v_{i+1}$ defining an angle equal to or smaller than the predefined threshold, i.e., $\theta_i \leq \theta_{thresh}$, are found, the boundary curve is shortened by inserting an additional boundary edge between the two outer boundary vertices $v_{i-1}$ and $v_{i+1}$. Inserting the additional boundary edge corresponds to the triangle $(v_{i-i}, v_i, v_{i+1})$. Upon inserting the additional boundary edge, the middle vertex $v_i$ is removed from the set of boundary vertices comprised by the boundary curve. As a result, the shortened boundary curve does not comprise the vertex $v_i$ anymore. The method may proceed with shortening the boundary curve 104 recursively, until no further triple of consecutive boundary vertices with an angle $\theta_k$ satisfying the predefined threshold $\theta_{thresh}$ can be found. For example, the aforementioned shortening may be used to add new triangles, i.e., additional boundary edges to the mesh. For example, the shortening may be the only way of adding new boundary edges to the mesh.

In block 204, it is checked, whether the mesh hole after shortening of the boundary curve already satisfies a termination criterion for terminating the filling. The termination criterion may be satisfied, in case the mesh hole is filled. The termination criterion may, e.g., require that all the boundary curves, i.e., the shortened boundary curves, comprise less than for four boundary vertices. For example, the shortened boundary curve may comprise three boundary vertices defining a triangle. In case the termination criterion is satisfied, the filling of the mesh hole is terminated and the mesh with the completely filled mesh hole is provided in block 212. In case the termination criterion is not satisfied, the method continues with block 206.

In block 206, a suitable location may be selected for splitting the mesh hole. For finding a suitable location, a maximized triple of boundary vertices comprising a first boundary vertex $v_i$, a second $v_j$ and a third boundary vertex $v_k$ is selected. The selected maximized triple satisfies the criterion, that the maximized angle is smaller than or equal to 90°. For such a selected maximized triple, the location for the splitting is defined by the first and second boundary vertices $v_i$, $v_j$ of the respective triplet.

The maximized triple is maximized by selecting for the given pair of the first and second boundary vertices $v_i$, $v_j$ a third boundary vertex $v_k$ such that a maximized angle between a first vector from the third boundary vertex $v_k$ to the first boundary vertex $v_i$, i.e., $(v_i\text{-}v_k)$, and a second vector from the third boundary vertex $v_k$ to the second boundary vertex $v_j$, i.e., $(v_j\text{-}v_k)$ is maximized compared to selecting any other boundary vertex of the boundary curve as the third boundary vertex. In other words, for each pair of boundary vertices, indicated by (i, j), comprised by the boundary curve a maximized triple of boundary vertices, indicated by (i, j, k), may be identified with a maximized angle $$\max_{k \neq i,j} \phi_{i,j,k}$$

of the triangle $(v_i, v_j, v_k)$ at $v_k$, i.e., between the vectors $(v_i\text{-}v_k)$ and $(v_j\text{-}v_k)$. From the resulting plurality of maximized triples, i.e., for all pairs of boundary vertices, a maximized triple may be selected with the maximized angle $$\max_{k \neq i,j} \phi_{i,j,k} \leq 90°.$$

For example, only triples may be taken into account, in which the first and second boundary vertices $v_i$, $v_j$ are connected by a single edge, i.e., with $j=i\pm1$. An additional criterion for selecting the maximized triple of boundary vertices may be that a distance between the first boundary vertex $v_i$ and the second boundary vertex $v_j$ of the selected maximized triple is a minimum distance compared to the distance of any other first and second boundary vertex of any other maximized triple of boundary vertices. An additional criterion for selecting the maximized triple of boundary vertices may be that the maximized angle between the first vector $(v_i\text{-}v_k)$ and the second vector $(v_j\text{-}v_k)$ of the selected maximized triple is a minimum $$\phi_{i,j} = \max_{k \neq i,j} \phi_{i,j,k}$$

compared to any other maximized angle between any other first and second vector of any other maximized triple.

In case no maximized triple satisfying the criterion, that the maximized angle is smaller than or equal to 90θ, can be found, a maximized triple may be selected which comprises a maximized angle that is a minimum maximized angle compared to any other maximized angle of any other maximized triple. Thus, the maximized triple for which $$\phi_{i,j} = \max_{k \neq i,j} \phi_{i,j,k}$$

as minimum compared to any other maximized triple may be selected.

In block 208, the boundary curve is split using the split location selected in block 204. The selected split location is provided by the first and second boundary vertices $v_i$, $v_j$ of the selected maximized triple. These boundary vertices $v_i$, $v_j$ are connected using a connecting curve from the first to the second boundary vertex. The connecting curve c: $[0,1] \to \mathbb{R}^3$ added connects $v_i$ to $v_j$, i.e., $c(0)=v_i$ and $c(1)=v_j$. Furthermore, the connecting curve may be tangential to the existing mesh surface at its endpoints. This may be achieved by making it orthogonal to the surface normal vectors $n_i$ at $v_i$ and $n_j$ at $v_j$, i.e., $c'(0)\cdot n_i=0$ and $c'(1)\cdot n_j=0$. The splitting may further comprise adding one or more additional boundary vertices along the connecting curve. By adding additional boundary vertices, i.e., $w_1, \ldots, w_r$, the boundary curve comprising the boundary vertices $v_1, \ldots, v_m$ may be split into two boundary curves. A first one of the new boundary curves may comprise the boundary vertices $v_1, \ldots, v_i, w_1, \ldots w_r, v_j, \ldots, v_m$, while a second one of the new boundary curves may comprise the boundary vertices $v_i, \ldots, v_j, w_r, \ldots, w_1$.

The positions of the additional boundary vertices $w_1, \ldots, w_r$, along the connecting curve may be chosen such that a distance between adjacent additional boundary vertices increases with an increasing distance from the boundary curve, i.e., from the closest one of boundary vertices $v_i$, $v_j$. In other words, the positions of the additional boundary vertices $w_1, \ldots, w_r$, along the connecting curve are chosen such that the lengths of the additional boundary edges defined by the additional vertices increase with increasing distance from the first closed boundary curve. Furthermore, a first length of a first additional edge connecting the first vertex $v_i$ with a first additional boundary vertex $w_1$ may match a length of another boundary edge connecting the first vertex $v_i$ with another boundary vertex of the boundary curve, i.e., $v_{i+1}$, or may match a first mean length calculated using edges connecting the first vertex $v_i$ with other vertices. Alternatively, the first mean length may be calculated using the edge connecting the first vertex of the selected maximized triple with an adjacent vertex which is no boundary vertex. Thus, e.g., any vertex adjacent the first vertex of the selected maximized triple may be used for calculating the first mean length, regardless of whether the respective adjacent vertex is a boundary vertex or not. An adjacent vertex of the first vertex of the selected maximized triple is a vertex, which is connected with the first vertex of the selected maximized triple by a single edge.

A second length of a second additional edge connecting the second vertex $v_j$ with a second additional boundary vertex $w_r$ may match a length of another boundary edge connecting the second vertex $v_j$ with another boundary vertex of the boundary curve, i.e., $v_{j\pm1}$, or may match a second mean length calculated using edges connecting the second vertex $v_j$ with other vertices. Alternatively, the second mean length may be calculated using the edge connecting the second vertex of the selected maximized triple with an adjacent vertex which is no boundary vertex. Thus, e.g., any vertex adjacent the second vertex of the selected maximized triple may be used for calculating the second mean length, regardless of whether the respective adjacent vertex is a boundary vertex or not. An adjacent vertex of the second vertex of the selected maximized triple is a vertex, which is connected with the second vertex of the selected maximized triple by a single edge.

Figure 6:
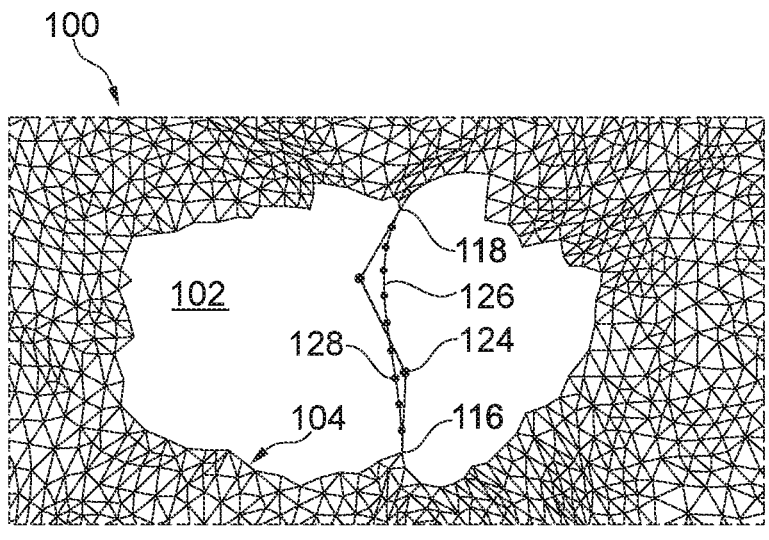
FIG. 6 shows an exemplary connection curve splitting a mesh hole.

The connecting curve may, e.g., be constructed as explained in detail in view of FIG. 6.

In block 210, it is checked, whether the mesh hole after the splitting of the boundary curve in block 208 satisfies the termination criterion for terminating the filling. In case the termination criterion is satisfied, the filling of the mesh hole is terminated and the mesh with the completely filled mesh hole is provided in block 212. In case the termination criterion is not satisfied, the method continues with block 202 for each of the meth holes resulting from the splitting the block 208. Thus, the filling may proceed recursively on the smaller boundary curves resulting from the splitting until the termination criterion is satisfied.

The 3D digital model comprising the mesh with the completely filled mesh hole may be provided in block 212 for further processing. For example, the 3D digital model may be modified, e.g., in order to adjust the 3D digital model to certain requirements. These requirements may, in case of a dental object, e.g., be individual requirements of an individual patient. For example, the 3D digital model may be used as a template for manufacturing a physical replica of the 3D digital object defined by the 3D digital model.

Figure 2:
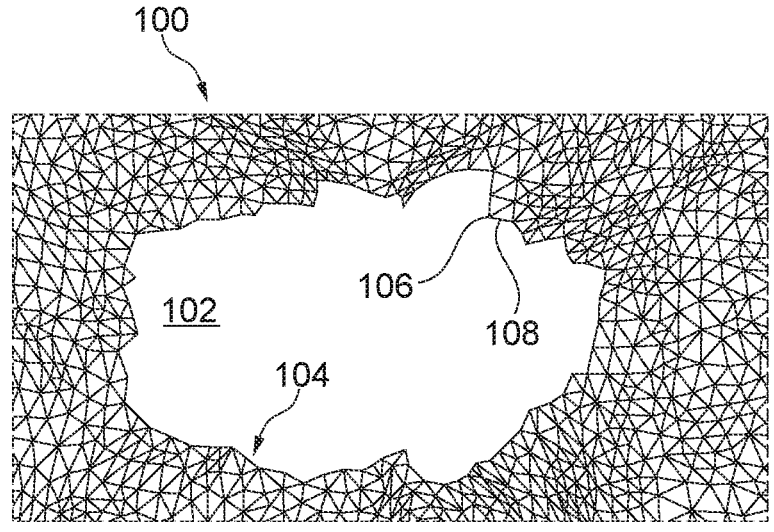
FIG. 2 shows an exemplary mesh hole in a mesh of a 3D digital model.

FIG. 2 shows an exemplary mesh 100 of a 3D digital model with a mesh hole 102. The mesh 100 comprises a plurality of vertices. Furthermore, using the vertices a plurality of edges may be defined. A boundary of the mesh hole 102 is provided by a closed boundary curve 104. The boundary curve 104 comprises boundary edges 108 connecting boundary vertices 106 of a plurality of boundary vertices. The plurality of boundary vertices comprises a number of boundary vertices 106. The number of boundary vertices 106 is four or more.

Figure 3:
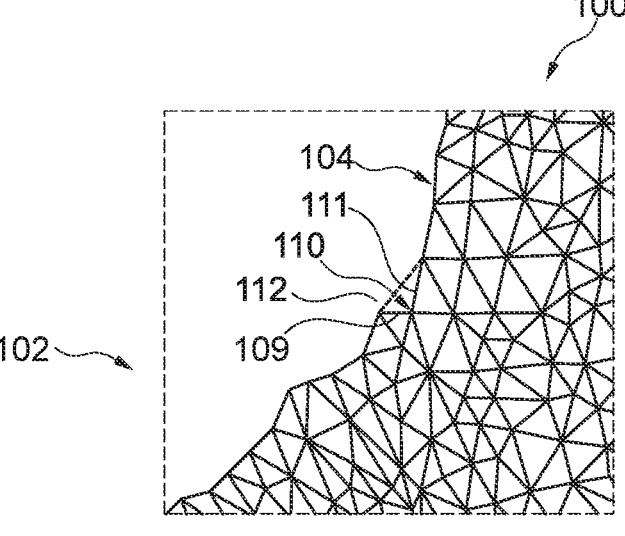
FIG. 3 shows an exemplary shortening of a boundary curve of a mesh hole.

FIG. 3 shows an exemplary shortening of a boundary curve 104 of a mesh hole 102 in a mesh 100. Thereby, the size of the boundary curve 104 in terms of the number of boundary vertices comprised by the boundary curve 104 may be reduced by one. This shortening of the boundary curve 104 is also referred to as "ear cutting". The shortening of the boundary curve 104 may be performed in order to prepare the boundary curve 104 for a splitting. Furthermore, new triangles may, e.g., be added to the mesh 100. Along the closed boundary curve 104 it is searched for three consecutive boundary vertices defining an angle $\theta_i$ 110 equal to or smaller than a predefined threshold $\theta_{thresh}$. The three consecutive boundary vertices define a first boundary edge 109 and a second boundary edge 111, between which the angle 110 is spanned. The angle 110 may, e.g., be a minimum angle compared any other angle between another first and second boundary edge connecting any other three consecutive boundary vertices along the boundary curve 104. In case three consecutive boundary vertices $v_{i-1}$, $v_i$ and $v_{i+1}$ defining an angle 110 equal to or smaller than a predefined threshold, i.e., $\theta_i \leq \theta_{thresh}$, are found, the boundary curve is shortened by inserting an additional boundary edge 112 between the two outer boundary vertices $v_{i-1}$ and $v_{i+1}$. The predefined threshold $\theta_{thresh}$, may for example be 75°, i.e., $\theta_{thresh}=75°$. Inserting the triangle ($v_{i-1}$, $v_i$, $v_{i+1}$), the middle vertex $v_i$ is removed from the set of boundary vertices comprised by the boundary curve 104. Thus, the shortened boundary curve 104 does not comprise the vertex $v_i$ anymore. The method may proceed with shortening the boundary curve 104 recursively, until no further triple of consecutive boundary vertices with an angle $\theta_k$ satisfying the predefined threshold $\theta_{thresh}$ can be found. After splitting the boundary curve 104, the shortening may be performed for each of the resulting two new the boundary curves recursively.

Figure 4:
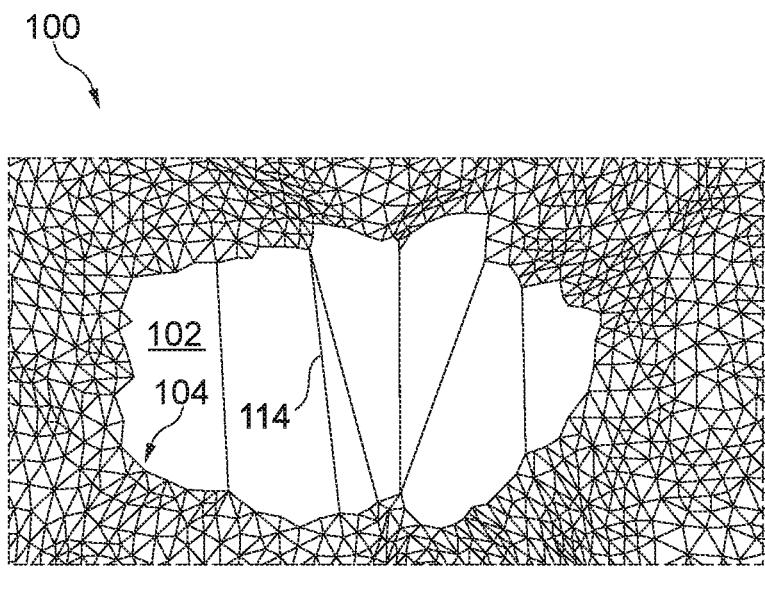
FIG. 4 shows an exemplary mesh hole with multiple suitable vector pairs for splitting the mesh hole.

FIG. 4 shows the exemplary mesh hole 102 in the mesh 100 of FIG. 1. In case of FIG. 4, there may be a plurality of splitting pair (i, j), for which a connecting edge 114 satisfies the Delaunay criterion, i.e., where a ball with diameter defined by the connecting edge 114 does not contain any other boundary vertices. Using a $\beta$-skeleton, a minimum $\beta$ may be defined for which the $\beta$-skeleton is non-empty. For splitting the boundary curve 104, the splitting pair (i, j) may be picked from this skeleton. In most cases the respective connecting edge 114 may be unique unless more than one edge is provided for this value of $\beta$. In case more than one edge is provided for this value of $\beta$, e.g., an arbitrary one of the edges provided may be chosen.

Figure 5:
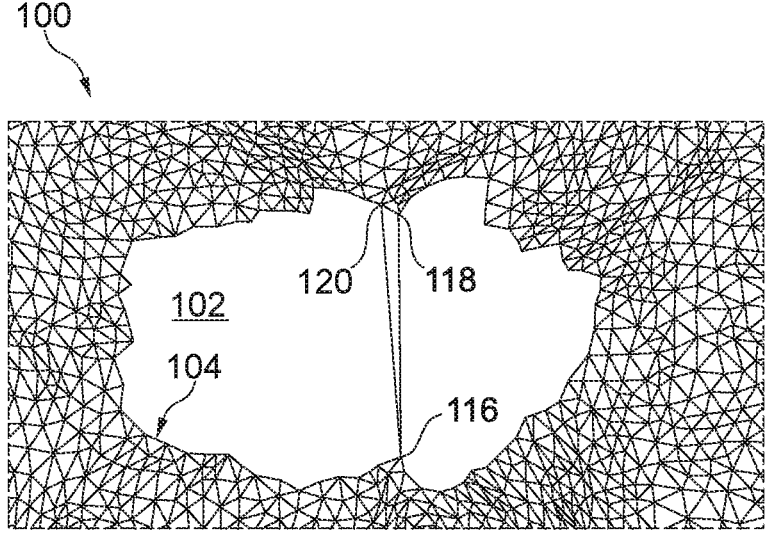
FIG. 5 shows an exemplary maximized triple of boundary vertices selected for splitting the mesh hole.

FIG. 5 shows exemplary mesh hole 102 in the mesh 100 of FIG. 1, in which a suitable splitting pair (i, j) comprising the vertices $v_i$ 116 and $v_j$ 118 is selected. The selected splitting pair (i, j) is part of a maximized triple of boundary vertices comprising the first boundary vertex 116, the second a second boundary vertex 118 and a third boundary vertex 120. For the third boundary vertex $v_k$ 120, the angle $\phi_{i,j,k}$ attains a maximum compared to any other boundary vertex of the boundary curve 104. The maximized angle $\phi_{i,j,k}$ of the selected splitting pair (i, j) may satisfy the criterion of $\phi_{i,j,k} \leq 90°$. The first and the second vertex 116, 118 of the this maximized triple of boundary vertices 116, 118, 120, i.e., the splitting pair (i, j) may be connected by a connecting curve from the first vertex 116 to the second vertex 118, in order to split the boundary curve 104 in two new boundary curves. Each of the two resulting new boundary curves being smaller than boundary curve 104.

FIG. 6 shows an exemplary connecting curve 126 constructed to the first vertex 116 to the second vertex 118 of the maximized triple of boundary vertices selected in FIG. 5. The connecting curve 126 used to connect the first and second vertex 116, 118 in the example according to FIG. 6 is a cubic Bezier curve. For constructing a cubic Bezier curve for control points 124, i.e., $p_0, \ldots, p_3$ are used. The first control point $p_0$ may be provided by the first vertex 116, i.e., $p_0=v_i$. The fourth control point $p_3$ may be provided by the second vertex 118, i.e., $p_3=v_j$. Then remaining two control points $p_1$ and $p_2$ may be defined as follows:

$$p_1 = v_i + \frac{1}{3}\vec{d}_i,$$

$$p_2 = v_j - \frac{1}{3}\vec{d}_j.$$

The vector $\vec{d}_{i,j} = v_j - v_i$ is the vector from the first vertex $v_i$ 116 to the second vertex $v_j$ 116. Using the vector $\vec{d}_{i,j}$ projections $\vec{d}_i$ and $\vec{d}_j$ of $\vec{d}_{i,j}$ into the tangential planes at $v_i$ and $v_j$, respectively, may be defined:

$$\vec{d}_i = \vec{d}_{i,j} - (\vec{d}_{i,j} \cdot n_i) n_i,$$

$$\vec{d}_j = \vec{d}_{i,j} - (\vec{d}_{i,j} \cdot n_j) n_j.$$

The projected vectors $\vec{d}_i$ and $\vec{d}_j$ may, e.g., be scaled to have the same length as $\vec{d}_{i,j}$.

Along the connecting curve 126 additional boundary vertices 128, i.e., Steiner vertices, may be added. By adding the additional boundary vertices 128, the connecting curve 126 is subdivided. For example, r additional boundary vertices 128, i.e., $w_1, \ldots, w_r$, may be added. The parameter r may, e.g., be chosen such that edge lengths at the beginning and end of the connecting curve 126 approximately match the lengths of edges at the boundary, i.e., at the boundary vertices 116, 118. For example, the parameter r may be chosen such that the edge lengths at the beginning and end of the connecting curve 126 match an average length of the edges at the vertices 118 and 116, respectively. Furthermore, the parameter r may be limited such that the sizes of the resulting new boundary curves in terms of a number of vertices are smaller than the size of the boundary curve 104. A first one of the two new boundary curves may comprise the segment of boundary curve 104 from boundary vertex 116 to boundary vertex 118 as well as the connecting curve 126 from boundary vertex 118 to boundary vertex 116. A second one of the two new boundary curves may comprise the segment of boundary curve 104 from boundary vertex 118 to boundary vertex 116 as well as the connecting curve 126 from boundary vertex 116 to from boundary vertex 118. By restricting the size of the connecting curve 126, i.e., the number of Steiner vertices added to the connecting curve 126, it may effectively be ensured that the method terminates. As long as the boundary curves resulting from a splitting are smaller than the preceding boundary curve being split, e.g., boundary curve 104, the method may, e.g., terminate, when all remaining boundary curves generated by splitting only comprise three boundary vertices, i.e., form triangles.

For example, a larger separation of the added vertices 128 may be chosen in the middle of the connecting curve 126 compared to the separation near 118 and the end 116 of the connecting curve 126. The distance between the added vertices 128 may, e.g., be the larger, the further away the respective vertices 128 are from the nearest end, i.e., vertex 116 or 118, of the boundary curve 126. For example, desired edge lengths a>0 and b>0 near vertex 118 and 116, respectively, may be defined. Furthermore, an incomplete curve parameter integral may be defined as $$I(x, y) := \int_0^x e^{\frac{\lambda(y-t)}{v} + \frac{\mu t}{v} + vt(v-t)} dt,$$

with $$\lambda := \log a,$$

$$\mu := \log b.$$

By adjusting the growth constant $v \geq 0$, it may be determined by how much edge lengths increase away from the boundary. It may hold that $$\left. \frac{\partial I}{\partial x}(x, y) \right|_{x=0} = a,$$

$$\left. \frac{\partial I}{\partial x}(x, y) \right|_{x=y} = b.$$

$I(x, y)$ has a closed formed representation involving the error function. A complete curve parameter integral may be defined as $I(y) := I(y, y)$. Since $I(y) = 0$ and $I'(y) > 0$, $I(y)$ is increasing. In fact, if $y > 0$, $I(y)$ may be increasing rather fast. Hence for a given connecting curve length $\ell > 0$, a $\bar{y} > 0$ may be found such that $I(\bar{y}) = \ell$ and $\bar{y}$ being small. The parameter r may, e.g., be chosen such that $r \approx \bar{y} - 1$ by rounding and bounding such that the resulting curves will be smaller than the original curve. A split vertex $w_k$ may be added at $$w_k = c \left( \frac{I(k, r+1)}{I(r+1)} \right).$$

In addition, new normal vectors may, e.g., be provided for the added boundary vertices $w_1, \ldots, w_r$. These new normal vectors may be computed by interpolating the normal vectors $n_i$ and $n_j$ at the boundary vertices 118, i.e., $v_i$, and 116, i.e., $v_j$, and making them orthogonal to the connecting curve 126.

Figure 7A:
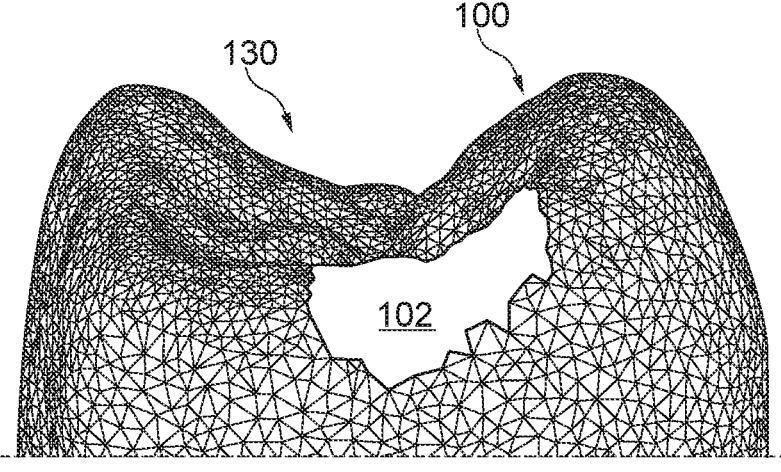
FIGS. 7A-7G show exemplary results of filling mesh holes using different methods.
Figure 7B:
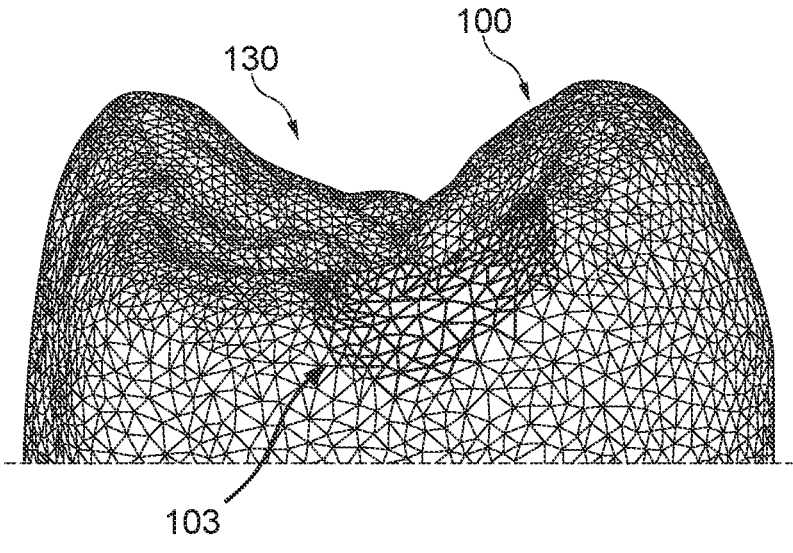
Figure 7C:
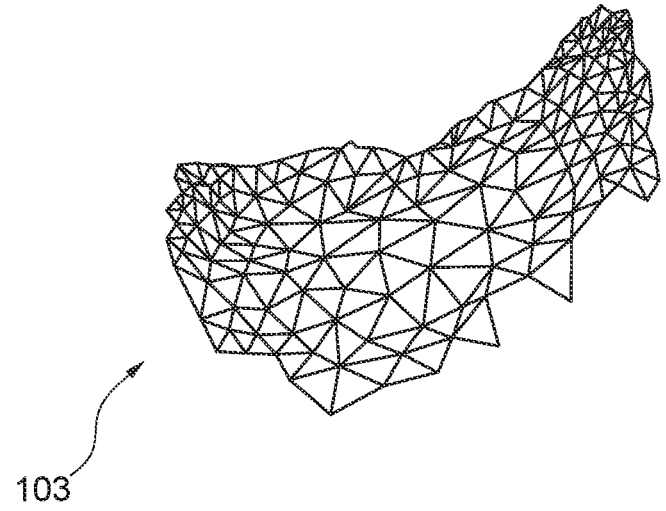
Figure 7D:
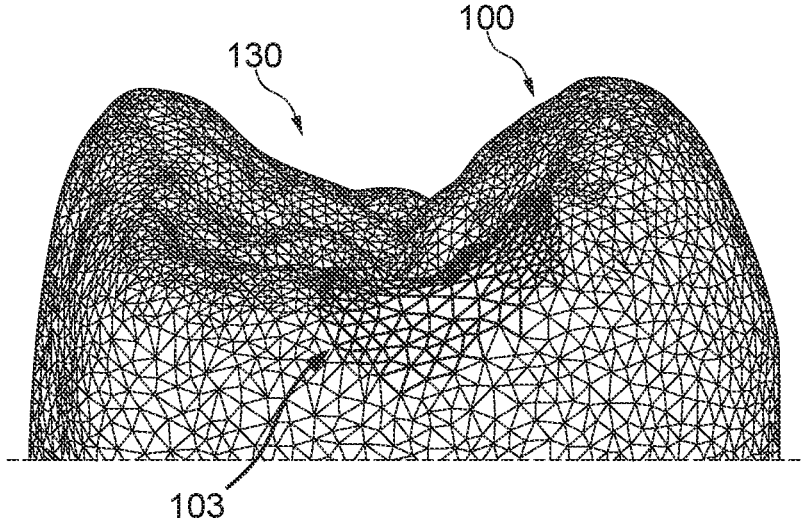
Figure 7E:
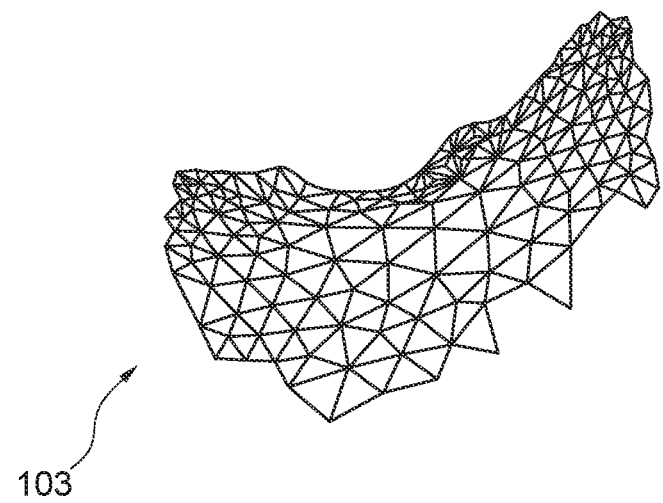
Figure 7F:
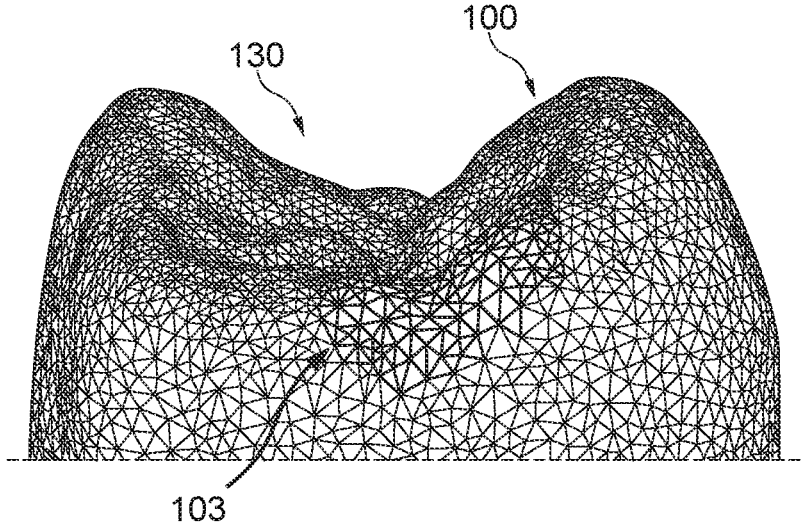
Figure 7G:
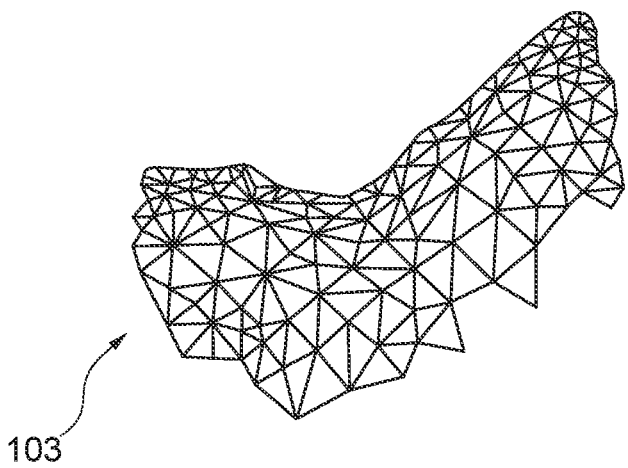

FIGS. 7A through 7G show different exemplary fillings 103 of a mesh hole 102 in a mesh 100 of a 3D digital model. The different exemplary fillings 103 are generated using different methods. The 3D digital model is a 3D digital model of a tooth 130. More precisely, a crown of a tooth 130 is shown in FIGS. 7A, 7B, 7D and 7F. The mesh 100 describes a geometry of a surface of the tooth 130. FIG. 7A shows the mesh 100 of tooth model 130 with the mesh hole 102 to be filled. FIG. 7B shows a filling 103 of the mesh hole 102 obtained by using the advancing front approach described in "A Robust Hole-Filling Algorithm for Triangular Mesh" by Wei Zhao et al. in "The Visual Computer", volume 23, 2007, pages 22 to 32. The resulting filling 103 is shown in more detail in FIG. 7C. The filling 103, i.e., the added surface section filling the mesh hole 102 as shown is ragged. For this reason, additional posterior refinement is required. A result of such a postprocessing in order to refine the filling surface 103 used to fill the mesh hole 102 in the mesh 100 of the 3D digital tooth model 130 is shown in FIG. 7D. Using the Laplace equation, the filling surface 103 of FIG. 7D is obtained, which has mean curvature of zero and does not smoothly extend the existing surface of the mesh 100. The transition from the initial section of mesh 100 to the mesh section 103 added to fill the mesh hole 102 is clearly visible. Furthermore, the grooves in the occlusal surface of tooth 130 do not extend into the filled mesh hole 102, i.e., the filling 103. The grooves, which actually should be there, are rather smoothed away by the postprocessing. The resulting filling 103 is shown in more detail in FIG. 7E. FIG. 7F shows the result of using the method describes herein. The resulting surface 103 filling mesh hole 102 is in comparison to the filling surface 103 of FIG. 7D more natural. For example, the filling surface is not ragged. Thus, contrary to the surface shown in FIG. 7B, no further refinement is required. Finally, geometrical features of the occlusal surface of tooth 130 are more pronounced in the interior of the filled mesh hole, e.g., the natural grooves in the occlusal surface of tooth 130 extend into the filled mesh hole 102, i.e., into the filling 103. FIG. 7G shows the respective filling 103 in more detail.

Figure 8A:
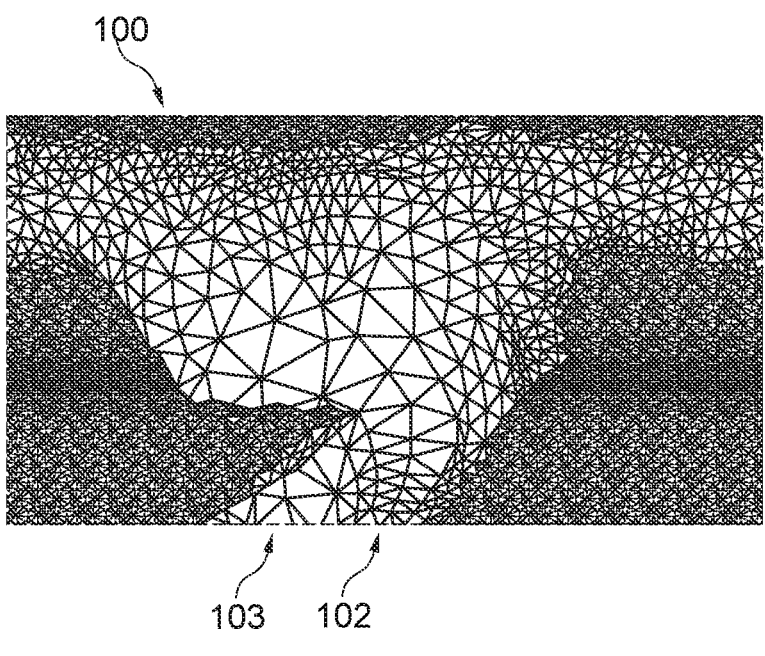
FIGS. 8A-8C show exemplary results of filling mesh holes using different methods.
Figure 8B:
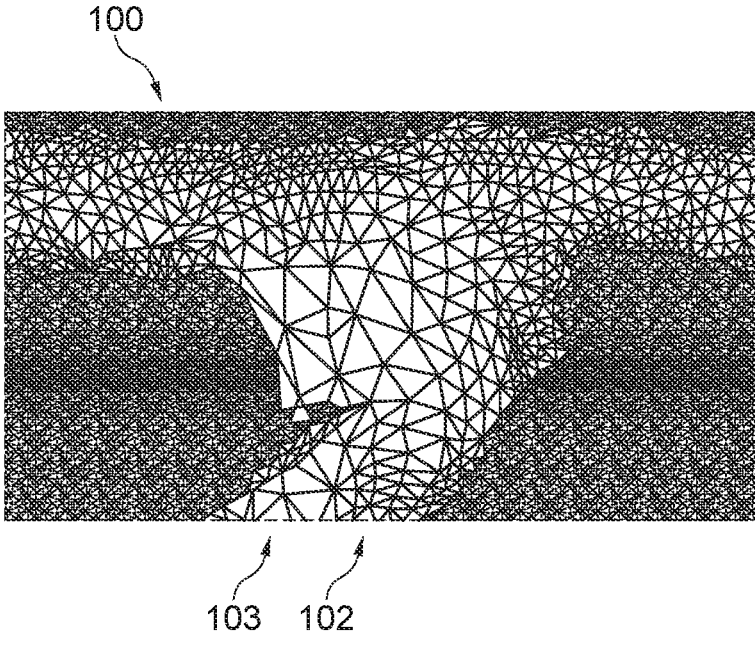
Figures 8C, 9:
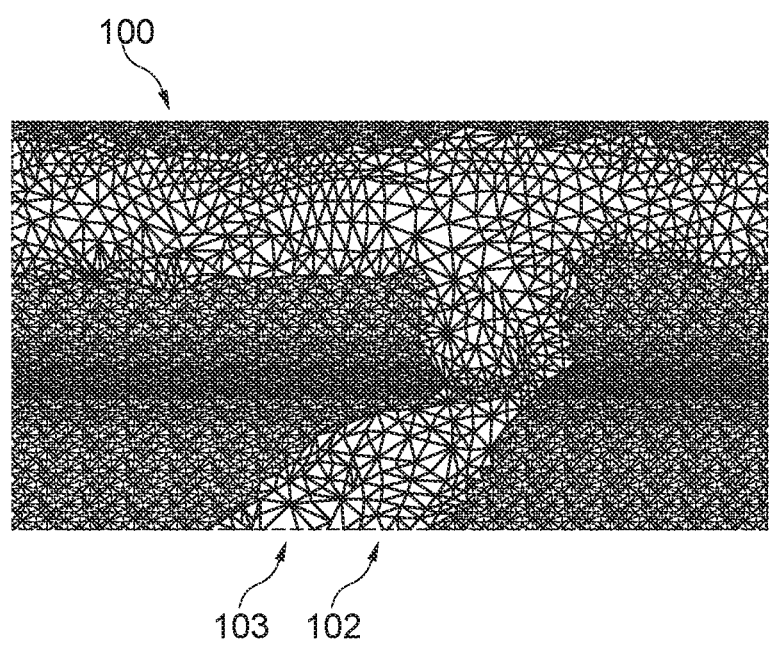
FIG. 9 shows an exemplary computer system for filling a mesh hole in a mesh of a 3D digital model.

FIG. 8A through 8C show different exemplary fillings 103 of a complex mesh hole 102 in a mesh 100 using different methods. FIG. 8A shows the result of using the advancing front approach. For a complex mesh hole 102, like the one shown in FIG. 8A, the advancing front approach may produce a filling 103 comprising artifacts of overlapping and/or self-intersecting geometries. FIG. 8B shows the result of a postprocessing in order to refine the filling surface 103 of FIG. 8A. As shown in FIG. 8B, the posterior refinement using the Laplace or Poisson equation may be unable to correct such issues, but rather introduce new artifacts into the filling 103. FIG. 8C shows the result of using the method describes herein. As shown in FIG. 8C, by using the method describes herein such a complex mesh hole 102 may be treated appropriately resulting in an artifact-free filling surface 103, which does not require additional refinements.

FIG. 9 shows a schematic diagram of an exemplary computer system 10 for filling a mesh hole in a mesh of a 3D digital model. The 3D digital model defined by the mesh comprising the mesh hole may be provided on the computer system 10. The 3D digital model may be reconstructed from a set of scan data acquired using a scanner, e.g., an optical scanner. The 3D digital model may alternatively be generated on the computer system 10, e.g., using templates provided by the computer system 10. The mesh hole may result from missing scan data, e.g., due to a partial obstruction of a view of the scanner. Alternatively, the mesh hole may result from removing an undesired portion of the mesh. Such a removal may be executed automatically, semiautomatically, or manually. Removing a portion of a mesh may for example be necessary in order to remove one or more scanning artifacts comprised by the respective portion. Furthermore, a portion of a mesh may be removed in order to remove a part or an element of the 3D object represented by the mesh of the 3D digital model. In case the 3D digital model represents a tooth, a dentition or a dental prosthesis, like a denture or partial denture, a mesh hole may result from removing part of a tooth or a complete tooth from the 3D digital model.

The computer system 10 may be operational with numerous other general-purpose or special-purpose computing system environments or configurations. Computer system 10 may be described in the general context of computer system executable instructions, such as program modules comprising executable program instructions, being executable by the computer system 10. Generally, program modules may include routines, programs, objects, components, logic, data structures, and so on that perform particular tasks or implement particular abstract data types. Computer system 10 may be practiced in distributed computing environments where tasks are performed by remote processing devices that are linked through a communications network. In a distributed computing environment, program modules may be located in both local and remote computer system storage media including memory storage devices.

In FIG. 9, computer system 10 is shown in the form of a general-purpose computing device. The components of computer system 10 may include, but are not limited to, one or more processors or processing units 16, a system memory 28, and a bus 18 that couples various system components including system memory 28 to processor 16. Bus 18 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus.

Computer system 10 may comprise a variety of computer system readable storage media. Such media may be any available storage media accessible by computer system 10, and include both volatile and non-volatile storage media, removable and non-removable storage media.

A system memory 28 may include computer system readable storage media in the form of volatile memory, such as random-access memory (RAM) 30 and/or cache memory 32. Computer system 10 may further include other removable/non-removable, volatile/non-volatile computer system storage media. For example, storage system 34 may be provided for reading from and writing to a non-removable, non-volatile magnetic media also referred to as a hard drive. For example, a magnetic disk drive for reading from and writing to a removable, non-volatile magnetic disk, e.g., a floppy disk, and an optical disk drive for reading from or writing to a removable, non-volatile optical disk such as a CD-ROM, DVD-ROM or other optical storage media may be provided. In such instances, each storage medium may be connected to bus 18 by one or more data media interfaces. Memory 28 may include at least one program product having a set of program modules, e.g., at least one program module, configured to carry out the filling a mesh hole in the mesh of a 3D digital model.

Program 40 may have a set of one or more program modules 42 and by way of example be stored in memory 28. The program modules 42 may comprise an operating system, one or more application programs, other program modules, and/or program data. Each of the operating system, one or more application programs, other program modules, and program data or some combination thereof, may include an implementation of a networking environment. One or more of the program modules 42 may carry out the filling of the mesh hole in the mesh of the 3D digital model.

Computer system 10 may further communicate with one or more external devices 14 such as a keyboard, a pointing device, like a mouse, and a display 24 enabling a user to interact with computer system 10. Such communication can occur via input/output (I/O) interfaces 22. Computer system 10 may further communicate with one or more networks such as a local area network (LAN), a general wide area network (WAN), and/or a public network, like the Internet, via network adapter 20. Network adapter 20 may communicate with other components of computer system 10 via bus 18. It should be understood that although not shown, other hardware and/or software components could be used in conjunction with computer system 10.

The computer system 10 shown in FIG. 9 may be configured for filling a mesh hole in a mesh of a 3D digital model. The computer system 10 may be a standalone computer with no network connectivity that may receive data to be processed through a local interface. The data received by computer system 10 may for example comprise scan data of a patient's mouth from an intraoral scan or from a scan of a classical mold/impression, e.g., providing information about the surface structure of the patient's tissue on which the denture is to be placed. This data may be used to generate the digital 3D digital model of the denture. Alternatively, the data received may, e.g., comprise digital 3D digital model of the denture. The computer system 10 may be used to fill a mesh hole in a mesh of a 3D digital model. Such operation may, however, likewise be performed using a computer system that is connected to a network such as a communications network and/or a computing network.

Figure 10:
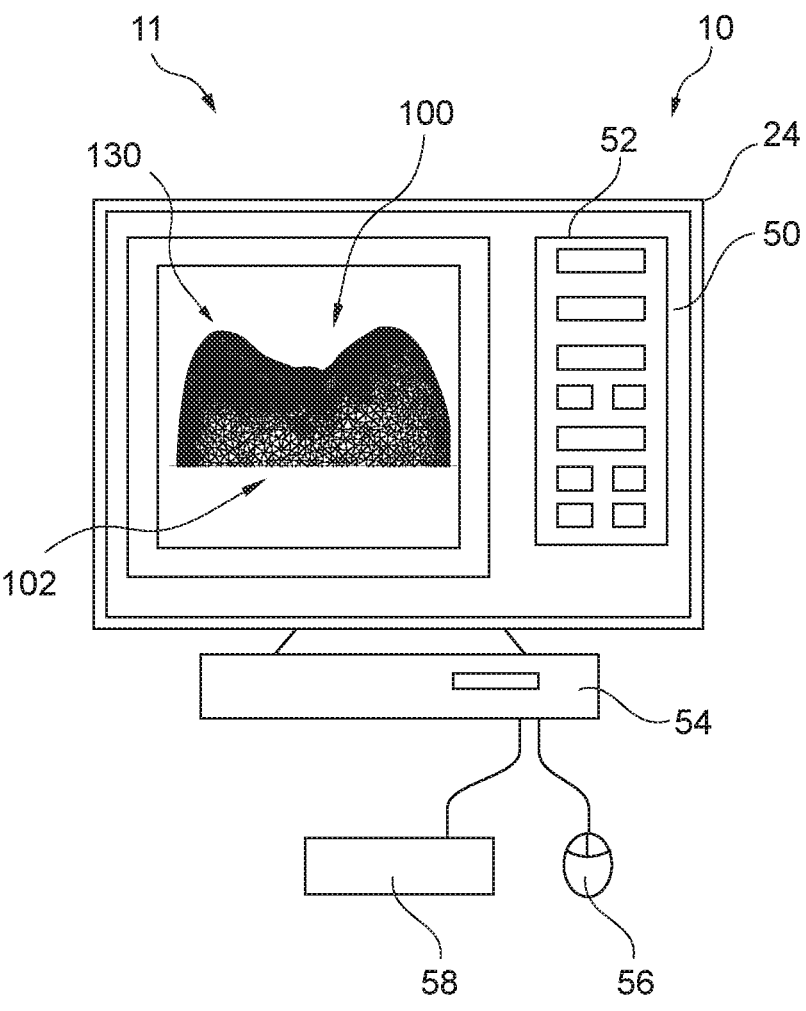
FIG. 10 shows an exemplary computer system for filling a mesh hole in a mesh of a 3D digital model.

FIG. 10 shows an exemplary system 11 comprising a computer system 10 for filling a mesh hole 102 in a mesh 100 of a 3D digital model. The computer system 10 may for example be configured as shown in FIG. 9. The computer system 10 may comprise a hardware component 54 comprising one or more processors as well as a memory storing machine-executable program instructions. Execution of the program instructions by the one or more processors may cause the one or more processors to control the computer system 10 to fill the mesh hole 102 in the mesh 100 of the 3D digital model, e.g., of a tooth 130. The computer system 10 may further comprise one or more input devices, like a keyboard 54 and a mouse 56, enabling a user to interact with the computer system 10. Furthermore, the computer system 10 may comprise one or more output devices, like a display 24 providing a user interface 50 with control elements 52 enabling the user to control the configurating of the split denture 100 using the computer system 10. The mesh 100 of the 3D digital model of the tooth 130 with the mesh hole 102 may be shown on the user interface 50. Using the control elements 52 may, e.g., be used to fill the mesh hole 102. The mesh hole 102 may result from missing scan data, e.g., due to a partial obstruction of a view of a scanner used to acquire the scan data. Furthermore, the control elements 52 may, e.g., be used to generate the mesh hole 102 or initiate a generation of the mesh hole 102. Generating the mesh hole 102 may comprise removing an undesired portion of the mesh 100. Such a removal may be executed automatically, semiautomatically, or manually using the computer system 10. Removing a portion of the mesh 100 may for example be necessary in order to remove one or more scanning artifacts comprised by the respective portion. Furthermore, a portion of a mesh 100 may have to be removed in order to remove a part or an element of the 3D object represented by the mesh 100.

Figure 11:
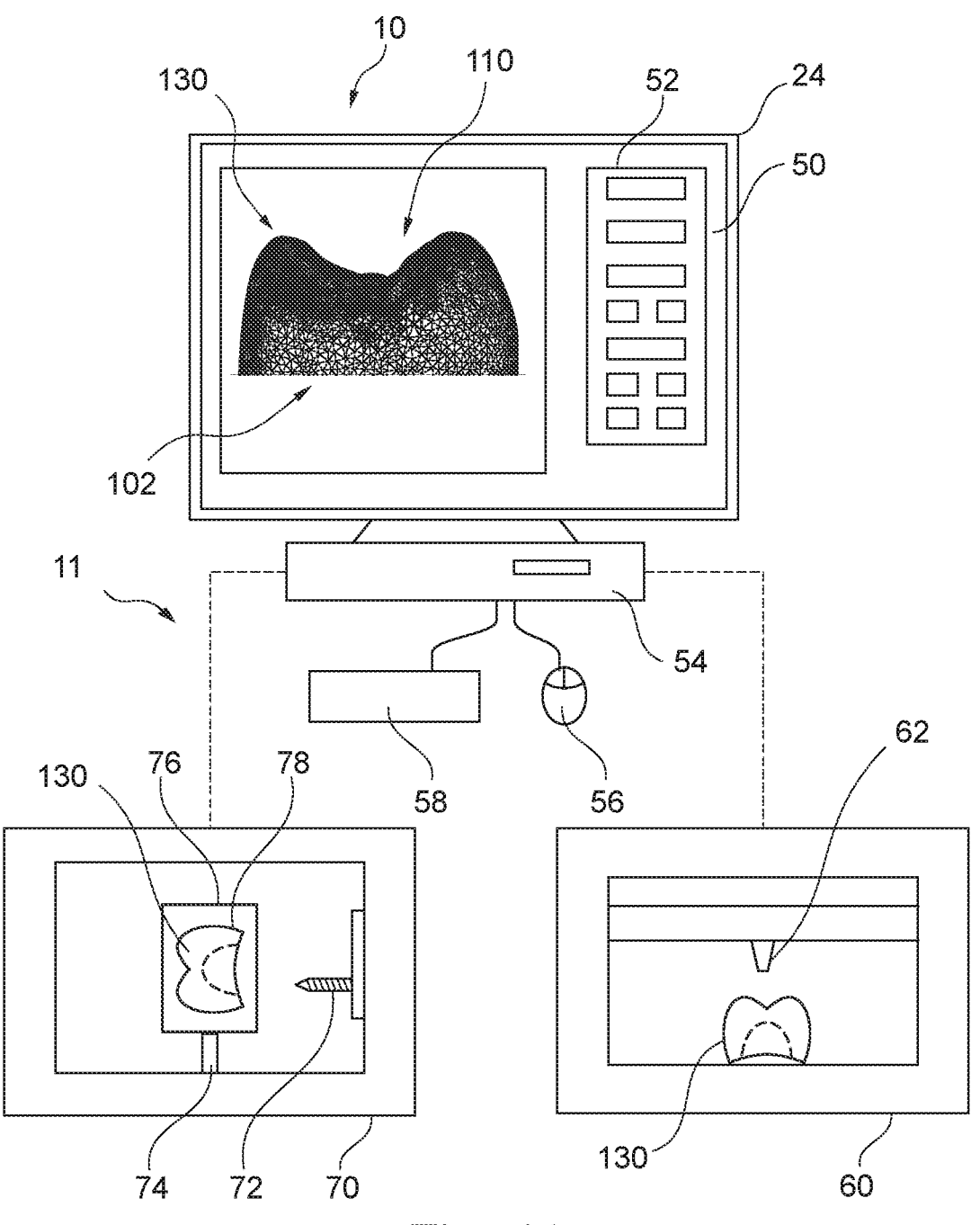
FIG. 11 shows an exemplary system for filling a mesh hole in a mesh of a 3D digital model and manufacturing an object according to the 3D digital model.

FIG. 11 shows an exemplary system 11 for filling a mesh hole in a mesh of a 3D digital model, which is furthermore configured to manufacture an object, like a tooth 130, defined by the 3D digital model. The manufactured model may be a physical copy of the 3D digital model which is used as a template for the manufacturing of the respective object. The system 11 may comprise the computer system 10 of FIG. 10. The computer system 10 may further be configured to control one or more manufacturing devices 60, 70. For example, the system 11 may comprise a manufacturing device in form of a machining device 70 controlled the computer system 10. The machining device 70 may be configured to machining a blank 76 using one or more machining tools 72. The blank 76 of raw material 78 may be provided using a holding device 74 and cut into a desired final shape and size of the object to be manufactured, e.g., a tooth 130, using the one or more machining tools 72 for executing a controlled material-removal process. The machining tool 72 may for example be a milling tool. The 3D digital model may provide a template of the physical object manufactured using the machining device 70. For example, the mesh 100 with the filled mesh hole 102 may define surfaces of the physical object manufactured.

For example, the system 11 may comprise a manufacturing device in form of a 3D printing device 60. The 3D printing device 60 may be controlled by the computer system 10 and configured to print the object to be manufactured, e.g., a tooth 130. The 3D printing device 60 may comprise a printing element 62 configured to print the respective object, like a tooth 130, layer by layer. The 3D digital model may provide a template of the physical object manufactured using the machining device 70. For example, the mesh 100 with the filled mesh hole 102 may define surfaces of the physical object manufactured.

While the invention has been illustrated and described in detail in the drawings and foregoing description, such illustration and description are to be considered illustrative or exemplary and not restrictive; the invention is not limited to the disclosed embodiments.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage. Any reference signs in the claims should not be construed as limiting the scope.

A single processor or other unit may fulfill the functions of several items recited in the claims. A computer program may be stored/distributed on a suitable medium, such as an optical storage medium or a solid-state medium supplied together with or as part of other hardware, but may also be distributed in other forms, such as via the Internet or other wired or wireless telecommunication systems.

As will be appreciated by one skilled in the art, aspects of the present invention may be embodied as an apparatus, method, computer program or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer executable code embodied thereon. A computer program comprises the computer executable code or "program instructions".

Any combination of one or more computer readable medium(s) may be utilized. The computer readable medium may be a computer readable signal medium or a computer readable storage medium. A "computer-readable storage medium" as used herein encompasses any tangible storage medium which may store instructions which are executable by a processor of a computing device. The computer-readable storage medium may be referred to as a computer-readable non-transitory storage medium. The computer-readable storage medium may also be referred to as a tangible computer readable medium. In some embodiments, a computer-readable storage medium may also be able to store data which is able to be accessed by the processor of the computing device. Examples of computer-readable storage media include, but are not limited to: a floppy disk, a magnetic hard disk drive, a solid-state hard disk, flash memory, a USB thumb drive, Random Access Memory (RAM), Read Only Memory (ROM), an optical disk, a magneto-optical disk, and the register file of the processor. Examples of optical disks include Compact Disks (CD) and Digital Versatile Disks (DVD), for example CD-ROM, CD-RW, CD-R, DVD-ROM, DVD-RW, or DVD-R disks. A further example of an optical disk may be a Blu-ray disk. The term computer readable-storage medium also refers to various types of recording media capable of being accessed by the computer device via a network or communication link. For example, a data may be retrieved over a modem, over the internet, or over a local area network. Computer executable code embodied on a computer readable medium may be transmitted using any appropriate medium, including but not limited to wireless, wireline, optical fiber cable, RF, etc., or any suitable combination of the foregoing.

A computer readable signal medium may include a propagated data signal with computer executable code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

"Computer memory" or "memory" is an example of a computer-readable storage medium. Computer memory is any memory which is directly accessible to a processor. "Computer storage" or "storage" is a further example of a computer-readable storage medium. Computer storage is any non-volatile computer-readable storage medium. In some embodiments, computer storage may also be computer memory or vice versa.

A "processor" as used herein encompasses an electronic component which is able to execute a program or machine executable instruction or computer executable code. References to the computing device comprising "a processor" should be interpreted as possibly containing more than one processor or processing core. The processor may for instance be a multi-core processor. A processor may also refer to a collection of processors within a single computer system or distributed amongst multiple computer systems. The term computing device should also be interpreted to possibly refer to a collection or network of computing devices each comprising a processor or processors. The computer executable code may be executed by multiple processors that may be within the same computing device or which may even be distributed across multiple computing devices.

Computer executable code may comprise machine executable instructions or a program which causes a processor to perform an aspect of the present invention. Computer executable code for carrying out operations for aspects of the present invention may be written in any combination of one or more programming languages, including an object-oriented programming language such as Java, Smalltalk, C++ or the like and conventional procedural programming languages, such as the "C" programming language or similar programming languages and compiled into machine executable instructions. In some instances, the computer executable code may be in the form of a high-level language or in a pre-compiled form and be used in conjunction with an interpreter which generates the machine executable instructions on the fly.

The computer executable code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Generally, the program instructions can be executed on one processor or on several processors. In the case of multiple processors, they can be distributed over several different entities like clients, servers etc. Each processor could execute a portion of the instructions intended for that entity. Thus, when referring to a system or process involving multiple entities, the computer program or program instructions are understood to be adapted to be executed by a processor associated or related to the respective entity.

Aspects of the present invention are described with reference to flowchart illustrations and/or block diagrams of methods, apparatus (systems) and computer program products according to embodiments of the invention. It will be understood that each block or a portion of the blocks of the flowchart, illustrations, and/or block diagrams, can be implemented by computer program instructions in form of computer executable code when applicable. It is further under stood that, when not mutually exclusive, combinations of blocks in different flowcharts, illustrations, and/or block diagrams may be combined. These computer program instructions may be provided to a processor of a general-purpose computer, special-purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Possible advantageous embodiments may comprise the following combinations of features:

1. A method for filling a mesh hole in a mesh of a 3D digital model, the mesh comprising by a plurality of vertices, the mesh further defining a plurality of edges, a boundary of the mesh hole being provided by a first closed boundary curve comprising boundary edges connecting boundary vertices of a first plurality of boundary vertices, the first plurality of boundary vertices comprising a first number of boundary vertices, with the first number of boundary vertices being four or more, wherein the method comprises:

selecting a maximized triple of boundary vertices comprising a first, a second and a third boundary vertex of the first plurality of boundary vertices without a single edge connecting the first and second vertex, wherein the selected maximized triple is maximized by selecting a boundary vertex of the first plurality of boundary vertices as the third boundary vertex of the selected maximized triple such that a maximized angle between a first vector from the third boundary vertex to the first boundary vertex and a second vector from the third boundary vertex to the second boundary vertex is maximized compared to selecting any other boundary vertex of the first plurality of boundary vertices as the third boundary vertex, wherein the selected maximized triple satisfies a first criterion, the first criterion requiring the maximized angle to be smaller than or equal to 90°, connecting the first and the second vertex of the selected maximized triple of boundary vertices using a connecting curve from the first to the second boundary vertex.

2. The method of item 1, wherein the connecting comprises adding one or more additional boundary vertices along the connecting curve.

3. The method of item 2, wherein the additional boundary edges connecting the first and the second vertex of the selected maximized triple via the additional boundary vertices split the first closed boundary curve into a new second and a new third closed boundary curve, the new second closed boundary curve comprising boundary edges connecting boundary vertices of a second plurality of boundary vertices including the additional boundary vertices, the second plurality of boundary vertices comprising a second number of boundary vertices, the new third closed boundary curve comprising boundary edges connecting boundary vertices of a third plurality of boundary vertices including the additional boundary vertices, the third plurality of boundary vertices comprising a third number of boundary vertices, the second and the third number of boundary vertices each being smaller than the first number of boundary vertices.

4. The method of any of the previous items, wherein the first and the second boundary vertex of the selected maximized triple further satisfy a second criterion, the second criterion requiring the distance between the first and the second boundary vertex of the selected maximized triple to be a minimum distance compared to the distance of any other first and second boundary vertex of any other maximized triple of boundary vertices, wherein the other maximized triples are each maximized by selecting a boundary vertex of the first plurality of boundary vertices as another third boundary vertex of the respective other maximized triple such that a maximized angle between another first vector from the other third boundary vertex of the respective other maximized triple to the other first boundary vertex of the respective other maximized triple and another second vector from the other third boundary vertex of the respective other maximized triple to the other second boundary vertex of the respective other maximized triple is maximized compared to selecting any other boundary vertex of the first plurality of boundary vertices as the other third boundary vertex of the respective other maximized triple.

5. The method of any of the previous items, wherein the selected maximized triple further satisfies a third criterion, the third criterion requiring the maximized angle between the first and the second vector of the selected maximized triple to be a minimum maximized angle compared to any other maximized angle between any other first and second vector of any other maximized triple.

6. The method of any of the previous items, wherein the third criterion is further used as fallback criterion for selecting a maximized triple, in case no maximized triple satisfying the first criterion.

7. The method of any of the previous items, wherein the method further comprises repeating the selecting of a maximized triple of boundary vertices and the connecting of a first and a second boundary vertex of the selected maximized triple for any new closed boundary curve until the number of remaining boundary vertices being smaller than four.

8. The method of any of the previous items, wherein the connecting curve is tangential to a mesh surface at the first and the second vertex of the selected maximized triple.

9. The method of item 8, wherein a curvature of the connecting curve at the first and the second vertex of the selected maximized triple matches with a curvature of the mesh surface at the first and the second vertex of the selected maximized triple.

10. The method of any of the previous items 2 to 9, wherein positions of the additional boundary vertices along the connecting curve are chosen such that the lengths of the additional boundary edges increase with increasing distance from the first closed boundary curve.

11. The method of any of the previous items 2 to 10, wherein a first length of a first additional edge connecting the first vertex of the selected maximized triple with a first additional boundary vertex of the additional boundary vertices matches to a length of another boundary edge connecting the first vertex of the selected maximized triple with another boundary vertex of the first closed boundary curve or matches to a first mean length calculated using edges connecting the first vertex of the selected maximized triple with other vertices and a second length of a second additional edge connecting the second vertex of the selected maximized triple with a second additional boundary vertex of the additional boundary vertices matches to a length of another boundary edge connecting the second vertex of the selected maximized triple with another boundary vertex of the first closed boundary curve or matches to a second mean length calculated using edges connecting the second vertex of the selected maximized triple with other vertices.

12. The method of any of the previous items, further comprising preparing the mesh hole and the first closed boundary curve for selecting the maximized triple, wherein the preparing comprises:

determining along the first closed boundary curve three consecutive boundary vertices comprising an angle between a first and a second boundary edge connecting the determined three consecutive boundary vertices, the angle being equal to or smaller than a predefined threshold, the first closed boundary curve is altered by inserting an additional boundary edge between the two outer boundary vertices of the determined three consecutive boundary vertices such that a middle boundary vertex of the determined three consecutive boundary vertices is excluded from the first plurality of boundary vertices.

13. The method of item 12, wherein the determining of three consecutive boundary vertices comprising an angle and the altering of the first closed boundary curve is repeated until the respective minimum angle of the respective determined three consecutive boundary vertices exceeds the predefined threshold.

14. The method of any of the previous items, wherein the 3D digital model comprises a plurality of structural elements, wherein the mesh hole results from removing one or more of the structural elements from the 3D digital model.

15. The method of any of the previous items, wherein the mesh of the 3D digital model results from a scan of a 3D physical structure.

16. The method of item 15, wherein the mesh hole results from incomplete scan data of the 3D physical structure or from removing one or more scan artifacts from the 3D digital model.

17. The method of any of the previous items, wherein the 3D digital model is a 3D digital model of a dental structure comprising one or more dental elements.

18. The method of any of the previous items, wherein the 3D digital model is used for generating a 3D digital template, wherein the 3D digital template is used for manufacturing a physical 3D copy of the 3D digital template.

19. A computer program product comprising a non-volatile computer-readable storage medium having computer-readable program code embodied therewith for filling a mesh hole in a mesh of a 3D digital model, the mesh comprising by a plurality of vertices, the mesh further defining a plurality of edges, a boundary of the mesh hole being provided by a first closed boundary curve comprising boundary edges connecting boundary vertices of a first plurality of boundary vertices, the first plurality of boundary vertices comprising a first number of boundary vertices, with the first number of boundary vertices being four or more, wherein the filling comprises:

selecting a maximized triple of boundary vertices comprising a first, a second and a third boundary vertex of the first plurality of boundary vertices without a single edge connecting the first and second vertex, wherein the selected maximized triple is maximized by selecting a boundary vertex of the first plurality of boundary vertices as the third boundary vertex of the selected maximized triple such that a maximized angle between a first vector from the third boundary vertex to the first boundary vertex and a second vector from the third boundary vertex to the second boundary vertex is maximized compared to selecting any other boundary vertex of the first plurality of boundary vertices as the third boundary vertex, wherein the selected maximized triple satisfies a first criterion, the first criterion requiring the maximized angle to be smaller than or equal to 90°, connecting the first and the second vertex of the selected maximized triple of boundary vertices using a connecting curve from the first to the second boundary vertex.

20. A computer system for filling a mesh hole in a mesh of a 3D digital model, the computer system comprising a processor and a memory storing machine-executable program instructions, the mesh comprising by a plurality of vertices, the mesh further defining a plurality of edges, a boundary of the mesh hole being provided by a first closed boundary curve comprising boundary edges connecting boundary vertices of a first plurality of boundary vertices, the first plurality of boundary vertices comprising a first number of boundary vertices, with the first number of boundary vertices being four or more, execution of the program instructions by the processor causing the processor to control the computer system to:

select a maximized triple of boundary vertices comprising a first, a second and a third boundary vertex of the first plurality of boundary vertices without a single edge connecting the first and second vertex, wherein the selected maximized triple is maximized by selecting a boundary vertex of the first plurality of boundary vertices as the third boundary vertex of the selected maximized triple such that a maximized angle between a first vector from the third boundary vertex to the first boundary vertex and a second vector from the third boundary vertex to the second boundary vertex is maximized compared to selecting any other boundary vertex of the first plurality of boundary vertices as the third boundary vertex, wherein the selected maximized triple satisfies a first criterion, the first criterion requiring the maximized angle to be smaller than or equal to 90°, connect the first and the second vertex of the selected maximized triple of boundary vertices using a connecting curve from the first to the second boundary vertex.

LIST OF REFERENCE NUMERALS

10 computer system
11 system
14 external device
16 processing unit
18 bus
20 network adapter
22 I/O interface
24 display
28 memory
30 RAM
32 cache
34 storage system
40 program
42 program module
50 user interface
52 control elements
54 hardware device
56 keyboard
58 mouse
60 3D printing device
62 printing element
70 machining device
72 machining tool
74 holding device
76 blank
78 raw material
100 mesh
102 mesh hole
103 mesh hole filling
104 boundary curve
106 boundary vertex
108 boundary edge
109 boundary edge
110 angle
111 boundary edge
112 boundary edge
114 connecting edge

116 boundary vertex
118 boundary vertex
120 boundary vertex
124 control point
126 connecting curve
128 vertex

The invention claimed is:

1. A method for filling a mesh hole in a mesh of a 3D digital model resulting from a scan of a 3D physical structure to enable manufacturing of a 3D physical copy, the mesh comprising a plurality of vertices, the mesh further defining a plurality of edges, a boundary of the mesh hole being provided by a first closed boundary curve comprising boundary edges connecting boundary vertices of a first plurality of boundary vertices, the first plurality of boundary vertices comprising a first number of boundary vertices, with the first number of boundary vertices being four or more, wherein the method comprises:

acquiring scan data of the 3D physical structure by scanning the 3D physical structure using a scanner, the acquired scan data being descriptive of a 3D geometrical form of a surface of the scanned 3D physical structure, providing the mesh of the 3D digital model of the 3D physical structure with the mesh hole using the acquired scan data of the 3D physical structure, wherein the 3D digital model is a digital replica of the scanned 3D physical structure and the mesh resembles the 3D geometrical form of the surface of the scanned 3D physical structure, determining for each pair of boundary vertices of the first plurality of boundary vertices a maximized triple resulting in a plurality of maximized triples for all pairs of boundary vertices of the first plurality of boundary vertices, wherein the determining of the plurality of maximized triples comprises for each pair of boundary vertices determining an additional boundary vertex of the first plurality of boundary vertices for which an angle between vectors from the determined additional boundary vertex to the boundary vertices of the respective pair of boundary vertices is larger than for using any other boundary vertex of the first plurality of boundary vertices as the additional boundary vertex, selecting from the plurality of maximized triples a maximized triple of boundary vertices comprising a first, a second and a third boundary vertex of the first plurality of boundary vertices without a single edge connecting the first and second vertex, wherein the selected maximized triple is maximized by selecting a boundary vertex of the first plurality of boundary vertices as the third boundary vertex of the selected maximized triple such that a maximized angle between a first vector from the third boundary vertex to the first boundary vertex and a second vector from the third boundary vertex to the second boundary vertex is maximized compared to selecting any other boundary vertex of the first plurality of boundary vertices as the third boundary vertex, wherein the selected maximized triple satisfies a first selection criterion, the first selection criterion requiring the maximized angle to be smaller than or equal to 90°, connecting the first and the second vertex of the selected maximized triple of boundary vertices using a connecting curve from the first to the second boundary vertex, generating a 3D digital template based on the 3D digital model, and manufacturing the physical 3D copy of the 3D digital template.

2. The method of claim 1, wherein the connecting comprises adding one or more additional boundary vertices along the connecting curve.

3. The method of claim 2, wherein the additional boundary edges connecting the first and the second vertex of the selected maximized triple via the additional boundary vertices split the first closed boundary curve into a new second and a new third closed boundary curve, the new second closed boundary curve comprising boundary edges connecting boundary vertices of a second plurality of boundary vertices including the additional boundary vertices, the second plurality of boundary vertices comprising a second number of boundary vertices, the new third closed boundary curve comprising boundary edges connecting boundary vertices of a third plurality of boundary vertices including the additional boundary vertices, the third plurality of boundary vertices comprising a third number of boundary vertices, the second and the third number of boundary vertices each being smaller than the first number of boundary vertices.

4. The method of claim 1, wherein the first and the second boundary vertex of the selected maximized triple further satisfy a second selection criterion, the second selection criterion requiring the distance between the first and the second boundary vertex of the selected maximized triple to be a minimum distance compared to the distance of any other first and second boundary vertex of any other maximized triple of boundary vertices, wherein the other maximized triples are each maximized by selecting a boundary vertex of the first plurality of boundary vertices as another third boundary vertex of the respective other maximized triple such that a maximized angle between another first vector from the other third boundary vertex of the respective other maximized triple to the other first boundary vertex of the respective other maximized triple and another second vector from the other third boundary vertex of the respective other maximized triple to the other second boundary vertex of the respective other maximized triple is maximized compared to selecting any other boundary vertex of the first plurality of boundary vertices as the other third boundary vertex of the respective other maximized triple.

5. The method of claim 1, wherein the selected maximized triple further satisfies a third selection criterion, the third selection criterion requiring the maximized angle between the first and the second vector of the selected maximized triple to be a minimum maximized angle compared to any other maximized angle between any other first and second vector of any other maximized triple.

6. The method of claim 5, wherein the third selection criterion is further used as fallback selection criterion for selecting a maximized triple, in case no maximized triple satisfies the first selection criterion.

7. The method of claim 1, wherein the method further comprises repeating the selecting of a maximized triple of boundary vertices and the connecting of a first and a second boundary vertex of the selected maximized triple for any new closed boundary curve until the number of remaining boundary vertices is smaller than four.

8. The method of claim 1, wherein the connecting curve is tangential to a mesh surface at the first and the second vertex of the selected maximized triple.

9. The method of claim 8, wherein a curvature of the connecting curve at the first and the second vertex of the selected maximized triple matches with a curvature of the mesh surface at the first and the second vertex of the selected maximized triple.

10. The method of claim 2, wherein positions of the additional boundary vertices along the connecting curve are chosen such that the lengths of the additional boundary edges increase with increasing distance from the first closed boundary curve.

11. The method of claim 2, wherein a first length of a first additional edge connecting the first vertex of the selected maximized triple with a first additional boundary vertex of the additional boundary vertices matches to a length of another boundary edge connecting the first vertex of the selected maximized triple with another boundary vertex of the first closed boundary curve or matches to a first mean length calculated using edges connecting the first vertex of the selected maximized triple with other vertices and
a second length of a second additional edge connecting the second vertex of the selected maximized triple with a second additional boundary vertex of the additional boundary vertices matches to a length of another boundary edge connecting the second vertex of the selected maximized triple with another boundary vertex of the first closed boundary curve or matches to a second mean length calculated using edges connecting the second vertex of the selected maximized triple with other vertices.

12. The method of claim 1, further comprising preparing the mesh hole and the first closed boundary curve for selecting the maximized triple, wherein the preparing comprises:
determining along the first closed boundary curve three consecutive boundary vertices comprising an angle between a first and a second boundary edge connecting the determined three consecutive boundary vertices, the angle being equal to or smaller than a predefined threshold, the first closed boundary curve is altered by inserting an additional boundary edge between the two outer boundary vertices of the determined three consecutive boundary vertices such that a middle boundary vertex of the determined three consecutive boundary vertices is excluded from the first plurality of boundary vertices.

13. The method of claim 12, wherein the determining of three consecutive boundary vertices comprising an angle and the altering of the first closed boundary curve is repeated until the respective minimum angle of the respective determined three consecutive boundary vertices exceeds the predefined threshold.

14. The method of claim 1, wherein the 3D digital model comprises a plurality of structural elements, wherein the mesh hole results from removing one or more of the structural elements from the 3D digital model.

15. The method of claim 1, wherein the mesh hole results from incomplete scan data of the 3D physical structure or from removing one or more scan artifacts from the 3D digital model.

16. The method of claim 1, wherein the 3D digital model is a 3D digital model of a dental structure comprising one or more dental elements.

17. A computer program product comprising a non-transitory computer-readable storage medium having computer-readable program code embodied therewith for filling a mesh hole in a mesh of a 3D digital model resulting from a scan of a 3D physical structure to enable manufacturing of a 3D physical copy, the mesh comprising a plurality of vertices, the mesh further defining a plurality of edges,
a boundary of the mesh hole being provided by a first closed boundary curve comprising boundary edges connecting boundary vertices of a first plurality of boundary vertices, the first plurality of boundary vertices comprising a first number of boundary vertices, with the first number of boundary vertices being four or more,
wherein the filling comprises:
acquiring scan data of the 3D physical structure by scanning the 3D physical structure using a scanner, the acquired scan data being descriptive of a 3D geometrical form of a surface of the scanned 3D physical structure,
providing the mesh of the 3D digital model of the 3D physical structure with the mesh hole using the acquired scan data of the 3D physical structure, wherein the 3D digital model is a digital replica of the scanned 3D physical structure and the mesh resembles the 3D geometrical form of the surface of the scanned 3D physical structure,
determining for each pair of boundary vertices of the first plurality of boundary vertices a maximized triple resulting in a plurality of maximized triples for all pairs of boundary vertices of the first plurality of boundary vertices, wherein the determining of the plurality of maximized triples comprises for each pair of boundary vertices determining an additional boundary vertex of the first plurality of boundary vertices for which an angle between vectors from the determined additional boundary vertex to the boundary vertices of the respective pair of boundary vertices is larger than for using any other boundary vertex of the first plurality of boundary vertices as the additional boundary vertex,
selecting from the plurality of maximized triples a maximized triple of boundary vertices comprising a first, a second and a third boundary vertex of the first plurality of boundary vertices without a single edge connecting the first and second vertex,
wherein the selected maximized triple is maximized by selecting a boundary vertex of the first plurality of boundary vertices as the third boundary vertex of the selected maximized triple such that a maximized angle between a first vector from the third boundary vertex to the first boundary vertex and a second vector from the third boundary vertex to the second boundary vertex is maximized compared to selecting any other boundary vertex of the first plurality of boundary vertices as the third boundary vertex,
wherein the selected maximized triple satisfies a first selection criterion, the first selection criterion requiring the maximized angle to be smaller than or equal to 90°,
connecting the first and the second vertex of the selected maximized triple of boundary vertices using a connecting curve from the first to the second boundary vertex,
generating a 3D digital template based on the 3D digital model, and manufacturing the physical 3D copy of the 3D digital template.

18. A computer system for filling a mesh hole in a mesh of a 3D digital model resulting from a scan of a 3D physical structure to enable manufacturing of a 3D physical copy, the computer system comprising a processor and a memory storing machine-executable program instructions, the mesh comprising a plurality of vertices, the mesh further defining a plurality of edges, a boundary of the mesh hole being provided by a first closed boundary curve comprising boundary edges connecting boundary vertices of a first plurality of boundary vertices, the first plurality of boundary vertices comprising a first number of boundary vertices, with the first number of boundary vertices being four or more, execution of the program instructions by the processor causing the processor to control the computer system to:

acquire scan data of the 3D physical structure by scanning the 3D physical structure using a scanner, the acquired scan data being descriptive of a 3D geometrical form of a surface of the scanned 3D physical structure, provide the mesh of the 3D digital model of the 3D physical structure with the mesh hole using the acquired scan data of the 3D physical structure, wherein the 3D digital model is a digital replica of the scanned 3D physical structure and the mesh resembles the 3D geometrical form of the surface of the scanned 3D physical structure, determine for each pair of boundary vertices of the first plurality of boundary vertices a maximized triple resulting in a plurality of maximized triples for all pairs of boundary vertices of the first plurality of boundary vertices, wherein the determining of the plurality of maximized triples comprises for each pair of boundary vertices determining an additional boundary vertex of the first plurality of boundary vertices for which an angle between vectors from the determined additional boundary vertex to the boundary vertices of the respective pair of boundary vertices is larger than for using any other boundary vertex of the first plurality of boundary vertices as the additional boundary vertex, select from the plurality of maximized triples a maximized triple of boundary vertices comprising a first, a second and a third boundary vertex of the first plurality of boundary vertices without a single edge connecting the first and second vertex, wherein the selected maximized triple is maximized by selecting a boundary vertex of the first plurality of boundary vertices as the third boundary vertex of the selected maximized triple such that a maximized angle between a first vector from the third boundary vertex to the first boundary vertex and a second vector from the third boundary vertex to the second boundary vertex is maximized compared to selecting any other boundary vertex of the first plurality of boundary vertices as the third boundary vertex, wherein the selected maximized triple satisfies a first selection criterion, the first selection criterion requiring the maximized angle to be smaller than or equal to 90°, connect the first and the second vertex of the selected maximized triple of boundary vertices using a connecting curve from the first to the second boundary vertex, generate a 3D digital template based on the 3D digital model, and manufacture a physical 3D copy of the 3D digital template.

* * * * *